United States Patent
Gendai

(10) Patent No.: US 8,068,404 B2
(45) Date of Patent: Nov. 29, 2011

(54) SIGNAL VALUE HOLDING APPARATUS, SIGNAL VALUE HOLDING METHOD, SIGNAL VALUE CONTROL SYSTEM, SIGNAL VALUE CONTROL METHOD, PLAYBACK APPARATUS, AND PLAYBACK METHOD

(75) Inventor: Yuji Gendai, Kanagawa (JP)

(73) Assignee: Sony Corporation, Tokyo (JP)

( * ) Notice: Subject to any disclaimer, the term of this patent is extended or adjusted under 35 U.S.C. 154(b) by 508 days.

(21) Appl. No.: 12/348,516

(22) Filed: Jan. 5, 2009

(65) Prior Publication Data

US 2009/0191820 A1 Jul. 30, 2009

(30) Foreign Application Priority Data

Jan. 28, 2008 (JP) ................................ 2008-016443

(51) Int. Cl.
*G11B 20/10* (2006.01)
(52) U.S. Cl. ................................ 369/124.05; 369/44.34
(58) Field of Classification Search ............. 369/124.05, 369/124.1, 124.11, 44.34, 59.21, 47.35; 372/59, 372/60, 72, 90
See application file for complete search history.

(56) References Cited

U.S. PATENT DOCUMENTS

| | | | | |
|---|---|---|---|---|
| 4,992,674 A | * | 2/1991 | Smith | 327/59 |
| 5,841,751 A | * | 11/1998 | Komazaki et al. | 369/124.05 |
| 7,352,668 B2 | * | 4/2008 | Shimakawa | 369/47.5 |
| 7,397,736 B2 | * | 7/2008 | Ogura | 369/44.34 |
| 7,791,995 B2 | * | 9/2010 | Yamamoto et al. | 369/47.27 |
| 2008/0122539 A1 | * | 5/2008 | Ide | 330/254 |

FOREIGN PATENT DOCUMENTS

JP 11-148950 6/1999

* cited by examiner

*Primary Examiner* — Thang Tran
(74) *Attorney, Agent, or Firm* — K&L Gates LLP

(57) ABSTRACT

A signal apparatus is provided. The signal value holding apparatus including a determining section to determine a magnitude relationship between a signal value of an input signal and a signal value of a prescribed feedback signal, a first holding section to hold the signal value determined to be larger by the determining section, a subtracting section to subtract a prescribed value from the signal value held by the first holding section and output a result as the feedback signal, and a second holding section to receive the signal value held by the first holding section and hold the signal value supplied from the first holding section when the signal value of the input signal becomes smaller than the signal value of the feedback signal based on a determination result of the magnitude relationship between the signal values by the determining section.

15 Claims, 18 Drawing Sheets

20A

SIGNAL VALUE HOLDING APPARATUS, SIGNAL VALUE HOLDING METHOD, SIGNAL VALUE CONTROL SYSTEM, SIGNAL VALUE CONTROL METHOD, PLAYBACK APPARATUS, AND PLAYBACK METHOD

CROSS REFERENCES TO RELATED APPLICATIONS

The present application claims priority to Japanese Patent Application JP 2008-016443 filed in the Japan Patent Office on Jan. 28, 2008, the entire contents of which is being incorporated herein by reference.

BACKGROUND

The present application relates to a signal value holding apparatus, a signal value holding method, a signal value control system, a signal value control method, a playback apparatus, and a playback method.

An automatic gain control (AGC) is used in a large variety of technical fields today. The AGC is used to maintain substantially constant signal value of an output signal, regardless of the signal value of an input signal. For example, although a received field intensity in a receiving device varies in the wireless communication field, the use of the AGC eliminates the negative effect of the variation of the received field intensity.

The AGC generally includes a variable gain amplifier (VGA) that adjusts the signal value of an input signal and outputs it, a peak hold circuit that evaluates the signal value of the signal supplied from the VGA, a control section that controls the VGA based on the signal value evaluated by the peak hold circuit, and so on. Thus, in order to enhance the performance of the AGC, the response of the peak hold circuit, which is an example of a signal value holding apparatus, is an important factor.

For example, as disclosed in Japanese Unexamined Patent Application Publication No. 11-148950, the peak hold circuit holds the peak value of an input signal at a prescribed droop rate, and, upon input of a signal value larger than the held peak value, updates the held peak value to the input signal value. The droop rate indicates quickness to decrease the held signal value. Thus, one approach to improve the response to an input signal with a decreasing signal value in the peak hold circuit is to increase the droop rate.

SUMMARY

However, if the droop rate is increased in order to improve the response to an input signal with a decreasing signal value in the peak hold circuit, the level of the held signal value becomes smaller on average, causing an increase in difference between the actual peak value of an input signal and the signal value held in the peak hold circuit.

In light of the foregoing, it is desirable to provide a signal value holding apparatus, a signal value holding method, a signal value control system, a signal value control method, a playback apparatus, and a playback method that improve the response to an input signal and decrease a difference between the actual peak value of an input signal and the held signal value.

According to an embodiment, there is provided a signal value holding apparatus including a determining section to determine a magnitude relationship between a signal value of an input signal and a signal value of a prescribed feedback signal, a first holding section to hold the signal value determined to be larger by the determining section, a subtracting section to subtract a prescribed value from the signal value held by the first holding section and output a result as the feedback signal, and a second holding section to receive the signal value held by the first holding section and hold the signal value supplied from the first holding section when the signal value of the input signal becomes smaller than the signal value of the feedback signal based on a determination result of the magnitude relationship between the signal values by the determining section.

In this configuration, the signal value held by the first holding section is the signal value of the feedback signal while the signal value of the feedback signal is larger than the signal value of the input signal, and it is the signal value of the input signal while the signal value of the feedback signal is smaller than the signal value of the input signal. Thus, the signal value of the feedback signal that is held by the first holding section while the signal value of the feedback signal is larger than the signal value of the input signal decreases with time because a prescribed value is subtracted by the subtracting section. On the other hand, the signal value of the input signal that is held by the first holding section while the signal value of the feedback signal is smaller than the signal value of the input signal increases with time according to the degree of increase in the signal value of the input signal.

If the signal value of the input signal that has increased starts decreasing, the signal value of the input signal is expected to be smaller than the signal value of the feedback signal. Thus, the second holding section holds the signal value supplied from the first holding section when the signal value of the input signal becomes smaller than the signal value of the feedback signal, so that the second holding section can hold the signal value that is closer to the peak value of the input signal even if the prescribed value subtracted by the subtracting section is increased.

The second holding section may update the held signal value while the signal value of the input signal is determined to be larger than the signal value of the feedback signal by the determining section, and hold the signal value while the signal value of the input signal is determined to be smaller than the signal value of the feedback signal by the determining section.

The signal value holding apparatus may further include a detecting section to detect a transition point where the signal value of the input signal becomes smaller than the signal value of the feedback signal based on a determination result of the magnitude relationship between the signal values by the determining section, and the second holding section may update the held signal value when the transition point is detected by the detecting section and hold the updated signal value until the next transition point is detected. In this configuration, the signal value held by the second holding section is updated only at the transition point, thereby reducing a variation (ripples) of the signal value held by the second holding section.

The signal value holding apparatus may further include a detecting section to detect a transition point where the signal value of the input signal becomes smaller than the signal value of the feedback signal based on a determination result of the magnitude relationship between the signal values by the determining section, and a control section to change the prescribed value to zero or near zero while the signal value of the input signal is determined to be larger than the signal value of the feedback signal by the determining section, and the second holding section may update the held signal value when the transition point is detected by the detecting section and hold the updated signal value until the next transition point is detected.

The signal value holding apparatus may further include a selector to receive the input signal and the feedback signal, and the selector may output the signal value determined to be larger by the determining section to the first holding section.

The prescribed value subtracted from the signal value held by the first holding section in the subtracting section may be variable. For example, an increase in the prescribed value subtracted by the subtracting section results in an increase in the degree of decrease in the signal value of the feedback signal while the signal value of the feedback signal is larger than the signal value of the input signal. On the contrary, a decrease in the prescribed value subtracted by the subtracting section results in a decrease in the degree of decrease in the signal value of the feedback signal while the signal value of the feedback signal is larger than the signal value of the input signal. Thus, the signal value of the feedback signal varies by the amount of the prescribed value subtracted by the subtracting section, which affects the signal value held by the second holding section. In light of this, the prescribed value subtracted by the subtracting section is set to be variable, thereby enabling adjustment of the characteristics of the signal value held by the second holding section as appropriate according to purpose and need.

The signal value holding apparatus may further include a smoothing filter to smooth a variation of the signal value held by the second holding section and output the smoothed signal. In this configuration, it is possible to output the smoothed signal value even when a noise is mixed in the input signal or the peak value of the input signal value varies excessively.

According to another embodiment, there is provided a signal value holding method including the steps of determining a magnitude relationship between a signal value of an input signal and a signal value of a prescribed feedback signal, holding by a first holding section the signal value determined to be larger by the determination, subtracting a prescribed value from the signal value held by the first holding section and outputting a result as the feedback signal, inputting the signal value held by the first holding section to a second holding section, and holding by the second holding section the signal value supplied from the first holding section when the signal value of the input signal becomes smaller than the signal value of the feedback signal based on a determination result of the magnitude relationship between the signal values.

According to another embodiment, there is provided a signal value control system including a first signal value holding apparatus, a control apparatus, and a signal value adjusting apparatus, wherein the first signal value holding apparatus includes a first determining section to determine a magnitude relationship between a signal value of an input signal from the signal value adjusting apparatus and a signal value of a prescribed feedback signal, a first holding section to hold the signal value determined to be larger by the first determining section, a subtracting section to subtract a prescribed value from the signal value held by the first holding section and output a result as the feedback signal, and a second holding section to receive the signal value held by the first holding section and hold the signal value supplied from the first holding section when the signal value of the input signal becomes smaller than the signal value of the feedback signal based on a determination result of the magnitude relationship between the signal values by the first determining section, the control apparatus controls the signal value adjusting apparatus based on the signal value held by the second holding section of the first signal value holding apparatus, and the signal value adjusting apparatus adjusts a signal value of an externally input signal based on control by the control apparatus and outputs the adjusted signal. Further, the signal value control system may further include a second signal value holding apparatus including a second determining section to determine a magnitude relationship between a signal value of the input signal and a signal value of a prescribed second feedback signal, a third holding section to hold the signal value determined to be smaller by the second determining section, an adding section to add a prescribed value to the signal value held by the third holding section and output a result as the second feedback signal, and a fourth holding section to receive the signal value held by the third holding section and hold the signal value supplied from the third holding section when the signal value of the input signal becomes larger than the signal value of the second feedback signal based on a determination result of the magnitude relationship between the signal values by the second determining section, wherein the control apparatus may control the signal value adjusting apparatus based on a difference between the signal value held by the second holding section of the first signal value holding apparatus and the signal value held by the fourth holding section of the second signal value holding apparatus.

According to another embodiment, there is provided a signal value control method executed in a signal value control system including a signal value holding apparatus, a control apparatus and a signal value adjusting apparatus, including the steps of determining a magnitude relationship between a signal value of an input signal from the signal value adjusting apparatus and a signal value of a prescribed feedback signal in the signal value holding apparatus, holding by a first holding section the signal value determined to be larger by the determination in the signal value holding apparatus, subtracting a prescribed value from the signal value held by the first holding section and outputting a result as the feedback signal in the signal value holding apparatus, inputting the signal value held by the first holding section to a second holding section in the signal value holding apparatus, holding by the second holding section the signal value supplied from the first holding section when the signal value of the input signal becomes smaller than the signal value of the feedback signal based on a determination result of the magnitude relationship between the signal values in the signal value holding apparatus, controlling the signal value adjusting apparatus based on the signal value held by the second holding section of the signal value holding apparatus in the control apparatus, and adjusting a signal value of an externally input signal based on control by the control apparatus and outputting the adjusted signal in the signal value adjusting apparatus.

According to another embodiment, there is provided a signal value holding apparatus including a determining section to determine a magnitude relationship between a signal value of an input signal and a signal value of a prescribed feedback signal, a first holding section to hold the signal value determined to be smaller by the determining section, an adding section to add a prescribed value to the signal value held by the first holding section and output a result as the feedback signal, and a second holding section to receive the signal value held by the first holding section and hold the signal value supplied from the first holding section when the signal value of the input signal becomes larger than the signal value of the feedback signal based on a determination result of the magnitude relationship between the signal values by the determining section.

In this configuration, the signal value held by the first holding section is the signal value of the feedback signal while the signal value of the feedback signal is smaller than the signal value of the input signal, and it is the signal value of the input signal while the signal value of the feedback signal is larger than the signal value of the input signal. Thus, the signal value of the feedback signal that is held by the first holding section while the signal value of the feedback signal is smaller than the signal value of the input signal increases with time because a prescribed value is sequentially added by the adding section. Accordingly, the signal value held by the first holding section is a larger value than the bottom value of the actual input signal. On the other hand, the signal value of the input signal that is held by the first holding section while the signal value of the feedback signal is larger than the signal value of the input signal decreases with time according to the degree of decrease in the signal value of the input signal.

If the signal value of the input signal that has decreased starts increasing, the signal value of the input signal is expected to become larger than the signal value of the feedback signal if the signal value of the input signal has been smaller than the signal value of the feedback signal. Thus, it is expected that the signal value of the input signal becomes larger than the signal value of the feedback signal at the rising edge of the input signal. In light of this, the second holding section holds the signal value supplied from the first holding section when the signal value of the input signal becomes larger than the signal value of the feedback signal, so that the second holding section can hold the signal value that is closer to the bottom value of the input signal even if the prescribed value added by the adding section is increased.

According to another embodiment, there is provided a signal value control method including the steps of determining a magnitude relationship between a signal value of an input signal and a signal value of a prescribed feedback signal, holding by a first holding section the signal value determined to be smaller by the determination, adding a prescribed value to the signal value held by the first holding section and outputting a result as the feedback signal, inputting the signal value held by the first holding section to a second holding section, and holding by the second holding section the signal value supplied from the first holding section when the signal value of the input signal becomes larger than the signal value of the feedback signal based on a determination result of the magnitude relationship between the signal values.

According to another embodiment, there is provided a playback apparatus including an optical pickup to read information recorded on an optical disc and output the information as a playback signal, a first signal value holding section to hold a maximum value of the playback signal output from the optical pickup, a second signal value holding section to hold a minimum value of the playback signal, a calculating section to calculate a difference between a signal value held by the first signal value holding section and a signal value held by the second signal value holding section, and an amplitude adjusting section to adjust an amplitude of the playback signal based on the difference calculated by the calculating section, wherein the first signal value holding section includes a first determining section to determine a magnitude relationship between a signal value of the playback signal and a signal value of a prescribed first feedback signal, a first holding section to hold the signal value determined to be larger by the first determining section, a subtracting section to subtract a prescribed value from the signal value held by the first holding section and output a result as the first feedback signal, and a second holding section to receive the signal value held by the first holding section and hold the signal value supplied from the first holding section as the maximum value when the signal value of the playback signal becomes smaller than the signal value of the first feedback signal based on a determination result of the magnitude relationship between the signal values by the first determining section, and the second signal value holding section includes a second determining section to determine a magnitude relationship between the signal value of the playback signal and a signal value of a prescribed second feedback signal, a third holding section to hold the signal value determined to be smaller by the second determining section, an adding section to add a prescribed value to the signal value held by the third holding section and output a result as the second feedback signal, and a fourth holding section to receive the signal value held by the third holding section and hold the signal value supplied from the third holding section as the minimum value when the signal value of the playback signal becomes larger than the signal value of the second feedback signal based on a determination result of the magnitude relationship between the signal values by the second determining section.

According to another embodiment, there is provided a playback method including the steps of reading information recorded on an optical disc and outputting the information as a playback signal, holding by a first signal value holding section a maximum value of the playback signal, holding by a second signal value holding section a minimum value of the playback signal, calculating a difference between a signal value held by the first signal value holding section and a signal value held by the second signal value holding section, and adjusting an amplitude of the playback signal based on the difference, wherein the holding step by the first signal value holding section includes determining a magnitude relationship between a signal value of the playback signal and a signal value of a prescribed first feedback signal, holding by a first holding section the signal value determined to be larger by the determination, subtracting a prescribed value from the signal value held by the first holding section and outputting a result as the first feedback signal, and receiving the signal value held by the first holding section and holding by a second holding section the signal value supplied from the first holding section as the maximum value when the signal value of the playback signal becomes smaller than the signal value of the first feedback signal based on a determination result of the magnitude relationship between the signal values, and the holding step by the second signal value holding section includes determining a magnitude relationship between the signal value of the playback signal and a signal value of a prescribed second feedback signal, holding by a third holding section the signal value determined to be smaller by the determination, adding a prescribed value to the signal value held by the third holding section and outputting a result as the second feedback signal, and receiving the signal value held by the third holding section and holding by a fourth holding section the signal value supplied from the third holding section as the minimum value when the signal value of the playback signal becomes larger than the signal value of the second feedback signal based on a determination result of the magnitude relationship between the signal values.

According to the embodiments described above, it is possible to improve the response to an input signal and decrease a difference between the actual peak value of an input signal and the held signal value.

Additional features and advantages are described herein, and will be apparent from the following Detailed Description and the figures.

DETAILED DESCRIPTION

Figure 1:
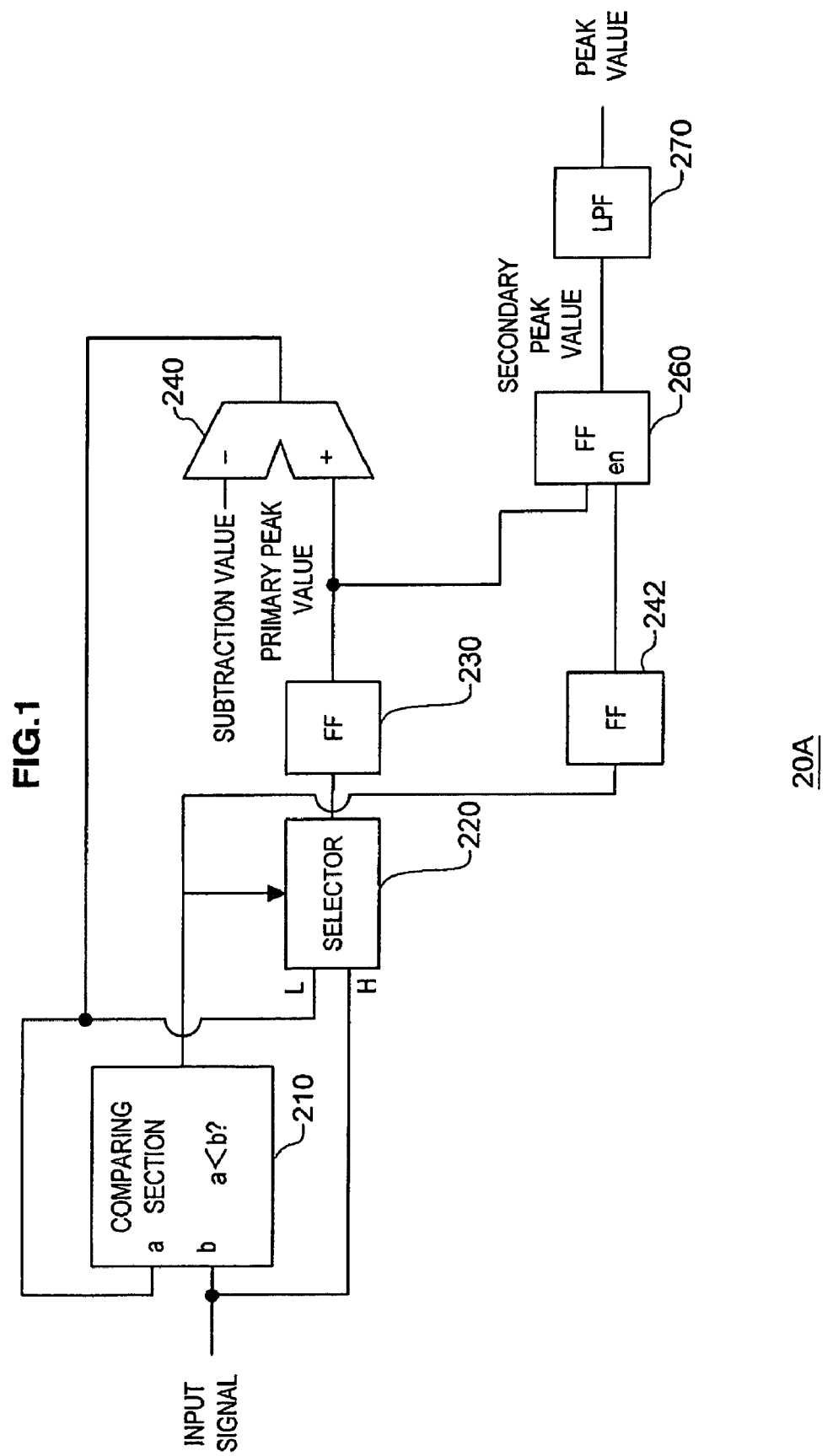
FIG. 1 is an explanatory view showing the configuration of a peak hold circuit according to a first configuration example.

Hereinafter, embodiments will be described in detail with reference to the appended drawings. Note that, in this specification and the appended drawings, structural elements that have substantially the same function and structure are denoted with the same reference numerals, and repeated explanation of these structural elements is omitted.

Embodiments will be described in the following order:
(1) Outline of the AGC
(2) Circumstances of development of an embodiment
(3) Configuration of the peak hold circuit
(First Configuration Example)
(Second Configuration Example)
(Third Configuration Example)
(4) Operation of the peak hold circuit
(5) Configuration of the bottom hold circuit
(6) Operation of the bottom hold circuit
(7) Optical disc apparatus including the peak hold circuit and the bottom hold circuit
(8) Summary (1) Outline of the AGC An automatic gain control (AGC) 1 to which a peak hold circuit 20 as an example of a signal value holding apparatus according to an embodiment is applied is schematically described hereinafter with reference to FIG. 4.

Figure 4:
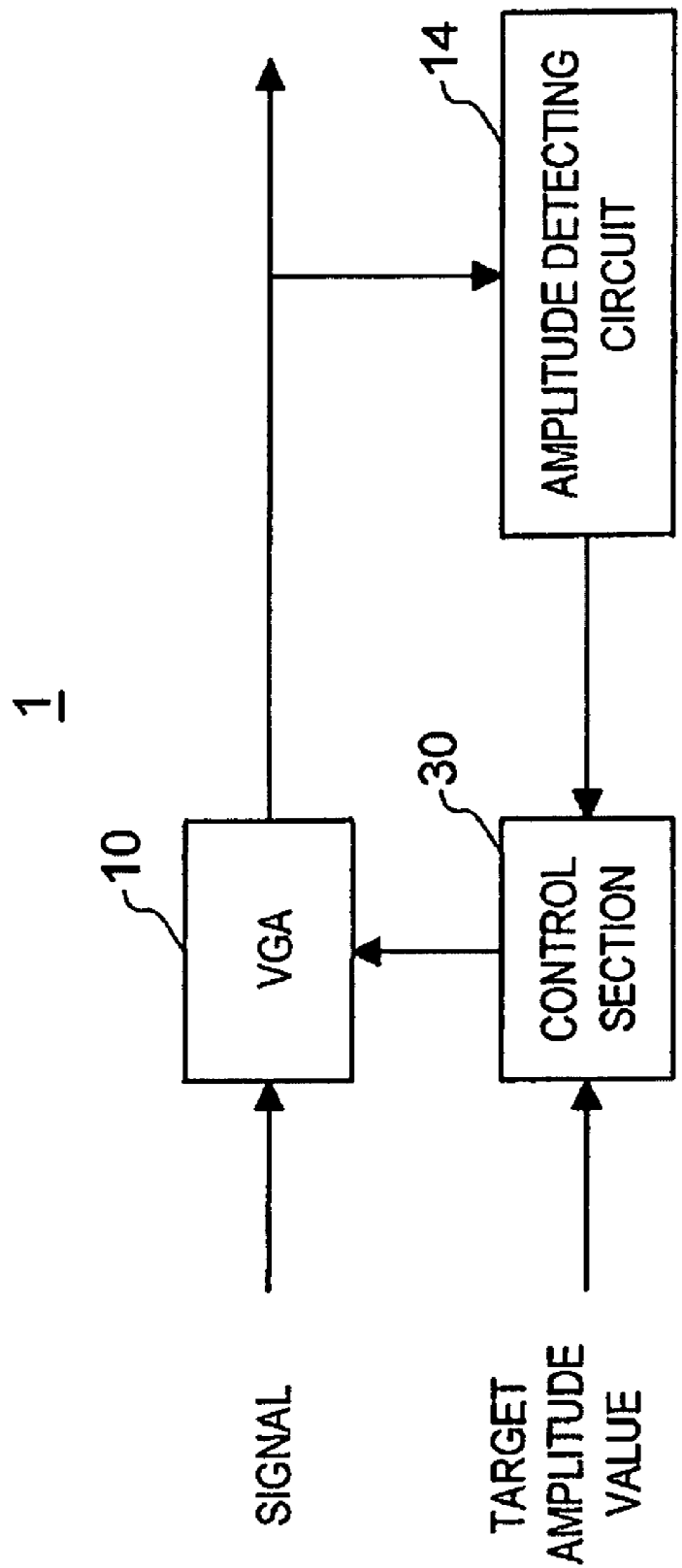
FIG. 4 is a functional block diagram showing the configuration of an AGC.

FIG. 4 is a functional block diagram showing the configuration of the AGC 1. The AGC 1 has a function to receive an input signal with a varying amplitude, adjust the amplitude of the input signal to the amplitude appropriate for signal processing in a subsequent stage and output the signal. As a specific means to implement such a function, the AGC 1 includes a variable gain amplifier (VGA) 10, an amplitude detection circuit 14, and a control section 30.

The VGA 10 (signal value adjusting apparatus) receives a signal having an amplitude to be adjusted and a control signal that is output from the control section 30. According to the input control signal, the VGA 10 adjusts the amplitude of the other input signal and outputs it. The signal that is output from the VGA 10 is output from the AGC 1 and input to the amplitude detection circuit 14.

The amplitude detection circuit 14 detects and holds the amplitude value (peak value) of the signal that is supplied from the VGA 10. In the description of the embodiment, the amplitude detection circuit 14 includes a peak hold circuit 20 that is described in "(3) Configuration of the peak hold circuit" and a bottom hold circuit 50 that is described in "(5) Configuration of the bottom hold circuit", and a difference between the signal values held in the peak hold circuit 20 and the bottom hold circuit 50 is treated as the amplitude value of the signal. In general, however, the amplitude detection circuit 14 may detect the average of the absolute value of the signal, the average power of the signal or the like.

The control section 30 (control apparatus) receives the amplitude value detected by the amplitude detection circuit 14 and a target amplitude value. The control section 30 outputs a control signal for controlling the VGA 10 based on a difference between the amplitude value detected by the amplitude detection circuit 14 and the target amplitude value. For example, if the amplitude value detected by the amplitude detection circuit 14 is larger than the target amplitude value, the control section 30 outputs a control signal for reducing the gain of the VGA 10.

In order to enhance the performance of the AGC 1, which is a feedback circuit of one kind, the response of the amplitude detection circuit 14 according to the embodiment is an important factor.

(2) Circumstances of Development of the Embodiment

The circumstances that the peak hold circuit 20 according to the embodiment has been invented are described hereinafter with reference to FIGS. 2 and 3.

Figure 2:
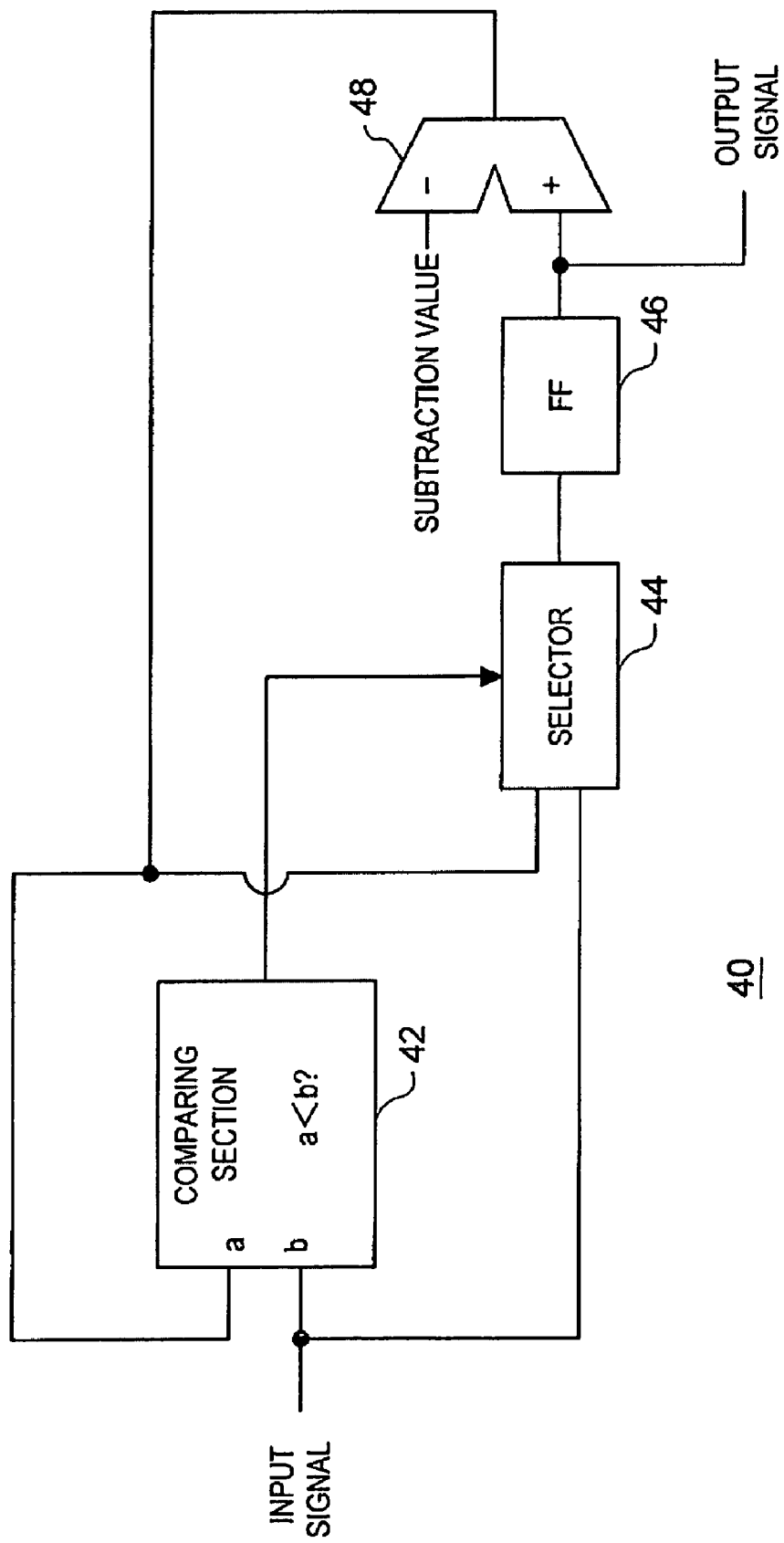
FIG. 2 is an explanatory view showing the configuration of a peak hold circuit according to a related art.

FIG. 2 is an explanatory view showing the configuration of a peak hold circuit 40 according to a related art. Referring to FIG. 2, the peak hold circuit 40 according to the related art includes a comparing section 42, a selector 44, a flip-flip 46 and a subtracting section 48.

The comparing section 42 includes an a-terminal to receive a feedback signal that is output from the subtracting section 48 and a b-terminal to receive an input signal. The comparing section 42 compares the signal value input through the a-terminal with the signal value input through the b-terminal, and outputs a control signal according to a comparison result to the selector 44. Specifically, the comparing section 42 outputs an L-signal when the signal value input through the a-terminal is larger than the signal value input through the b-terminal, and outputs an H-signal when the signal value input through the a-terminal is smaller than the signal value input through the b-terminal.

The selector 44 receives the feedback signal that is output from the subtracting section 48, an externally input signal, and the control signal that is output from the comparing section 42. The selector 44 outputs either one of the feedback signal or the input signal according to the control signal that is output from the comparing section 42. Specifically, the selector 44 outputs the feedback signal while the L-signal is supplied from the comparing section 42 and outputs the input signal while the H-signal is supplied from the comparing section 42.

The flip-flip (FF) 46 holds the signal value of the signal that is output from the selector 44 and further updates the held signal value in synchronization with a reference clock.

The subtracting section 48 subtracts a prescribed subtraction value from the signal that is held by the flip-flip 46 and outputs a result as a feedback signal. The feedback signal is input to the comparing section 42 and the selector 44.

In the peak hold circuit 40 according to the related art, the signal value that is held by the flip-flip 46 is output as a peak value of the input signal.

Figure 3:
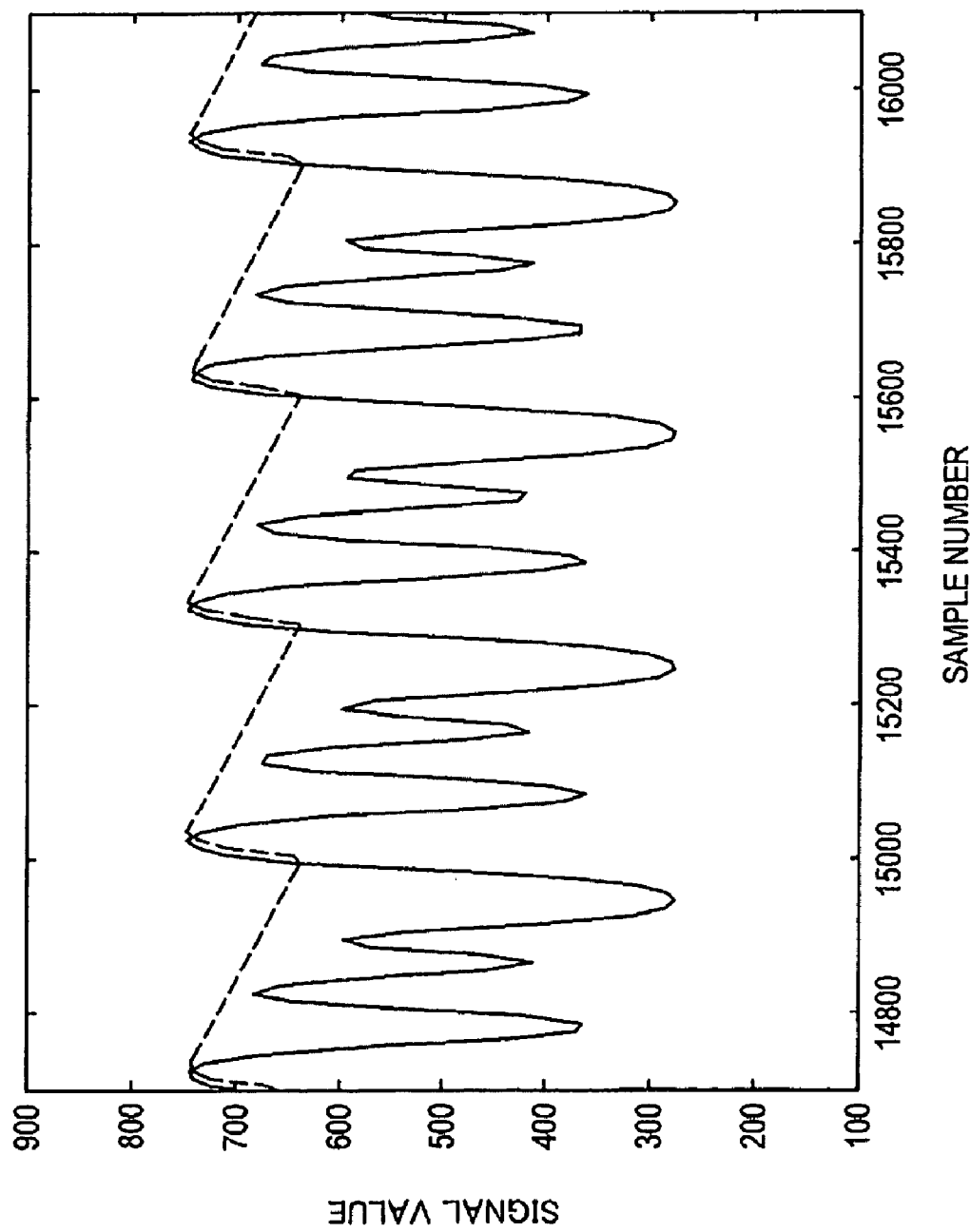
FIG. 3 is an explanatory view showing an example of a peak value output from a peak hold circuit according to a related art.

FIG. 3 is an explanatory view showing an example of a peak value that is output from the peak hold circuit 40 according to the related art. In FIG. 3, the horizontal axis indicates a sample number of an input signal, and the vertical axis indicates a bit value of a signal value. In FIG. 3, the solid line indicates an input signal, and the dotted line indicates a peak value that is output from the peak hold circuit 40 to which the input signal indicated by the solid line is input.

As shown in FIG. 3, the peak value that is output from the peak hold circuit 40 repeatedly decreases and increases. When viewed as a whole, the peak value that is output from the peak hold circuit 40 is smaller than the actual peak value of the input signal.

One approach to approximate the peak value output from the peak hold circuit 40 to the actual peak value of the input signal is to reduce a subtraction value to be subtracted in the subtracting section 48, for example. However, reduction of the subtraction value to be subtracted in the subtracting section 48 causes degradation of the response characteristics of the peak hold circuit 40 with respect to the input signal with a decreasing signal value.

Another approach to approximate the peak value output from the peak hold circuit 40 to the actual peak value of the input signal is to add a given value to the peak value output from the peak hold circuit 40. In this case, however, it is necessary to prepare a means to determine a value to be added, and it is difficult to appropriately determine a value to be added.

Given such circumstances, the peak hold circuit 20 according to the embodiment has been invented. Likewise, the AGC 1 that includes the peak hold circuit 20, the bottom hold circuit 50, and an optical disc apparatus 60 that includes the peak hold circuit 20 and the bottom hold circuit 50 have been invented. The peak hold circuit 20 according to the embodiment, for example, enables improvement of the response to an input signal and a decrease in a difference between the actual peak value of an input signal and the held signal value. The embodiments are described hereinafter in detail sequentially, beginning with the peak hold circuit 20.

(3) Configuration of the Peak Hold Circuit

A first configuration example, a second configuration example and a third configuration example of the peak hold circuit 20 according to the exemplary embodiment are described hereinafter.

(First Configuration Example)

FIG. 1 is an explanatory view showing the configuration of a peak hold circuit 20A according to the first configuration example. Referring to FIG. 1, the peak hold circuit 20A includes a comparing section 210, a selector 220, a flip-flop 230, a subtracting section 240, a flip-flop 242, a flip-flop 260, and a low-pass filter (LPF) 270.

The comparing section 210 includes an a-terminal to receive a feedback signal that is output from the subtracting section 240 and a b-terminal to receive an input signal. The comparing section 210 has a function as a determining section that compares the signal value input through the a-terminal and the signal value input through the b-terminal and outputs a control signal according to a comparison result to the selector 220. Specifically, the comparing section 210 may output an L-signal when the signal value input through the a-terminal is larger than the signal value input through the b-terminal, and output an H-signal when the signal value input through the a-terminal is smaller than the signal value input through the b-terminal.

The selector 220 receives the feedback signal that is output from the subtracting section 240, an externally input signal, and the control signal that is output from the comparing section 210. The selector 220 outputs either one of the feedback signal or the input signal according to the control signal that is output from the comparing section 210. Specifically, the selector 220 may output the feedback signal while the L-signal is supplied from the comparing section 210, and output the input signal while the H-signal is supplied from the comparing section 210.

The flip-flip (FF) 230 has a function as a first holding section that holds the signal value of the signal that is output from the selector 220 as a primary peak value. Further, the flip-flop 230 updates the held signal value in synchronization with a reference clock.

The subtracting section 240 subtracts a prescribed subtraction value (droop rate) from the signal that is held by the flip-flip 230 and outputs a result as a feedback signal. The feedback signal is input to the comparing section 210 and the selector 220. The droop rate is variable, and the characteristics of the peak value that is obtained from the peak hold circuit 20 can be adjusted by changing the droop rate.

The flip-flop 242 holds the control signal that is output from the comparing section 210 for one clock period.

The flip-flop 260 receives the signal value that is held by the flip-flop 230 and the signal that is output from the flip-flop 242. Further, the flip-flop 260 has a function as a second holding section that holds and updates the signal value held by the flip-flop 230 as a secondary peak value, triggered by input of the H-signal from the flip-flop 242. The flip-flop 260 repeatedly updates the held signal value while the value of the input signal is larger than the value of the feedback signal.

The low-pass filter 270 functions as a smoothing filter that smoothes the value held by the flip-flop 260 and outputs the result.

As described above, the flip-flop 260 maintains the held signal value while the value of the input signal is smaller than the value of the feedback signal. Thus, the peak hold circuit 20A according to the first configuration example can continuously hold the value that is close to the actual peak value of the input signal.

(Second Configuration Example)

In the peak hold circuit 20A according to the first configuration example, however, the signal value held by the flip-flop 260 decreases abruptly when the value of the input signal becomes larger than the value of the feedback signal, causing the occurrence of ripples. In contrast, a peak hold circuit 20B according to the second configuration example prevents ripples from occurring when the value of the input signal becomes larger than the value of the feedback signal. The peak hold circuit 20B according to the second configuration example is described hereinafter.

Figure 5:
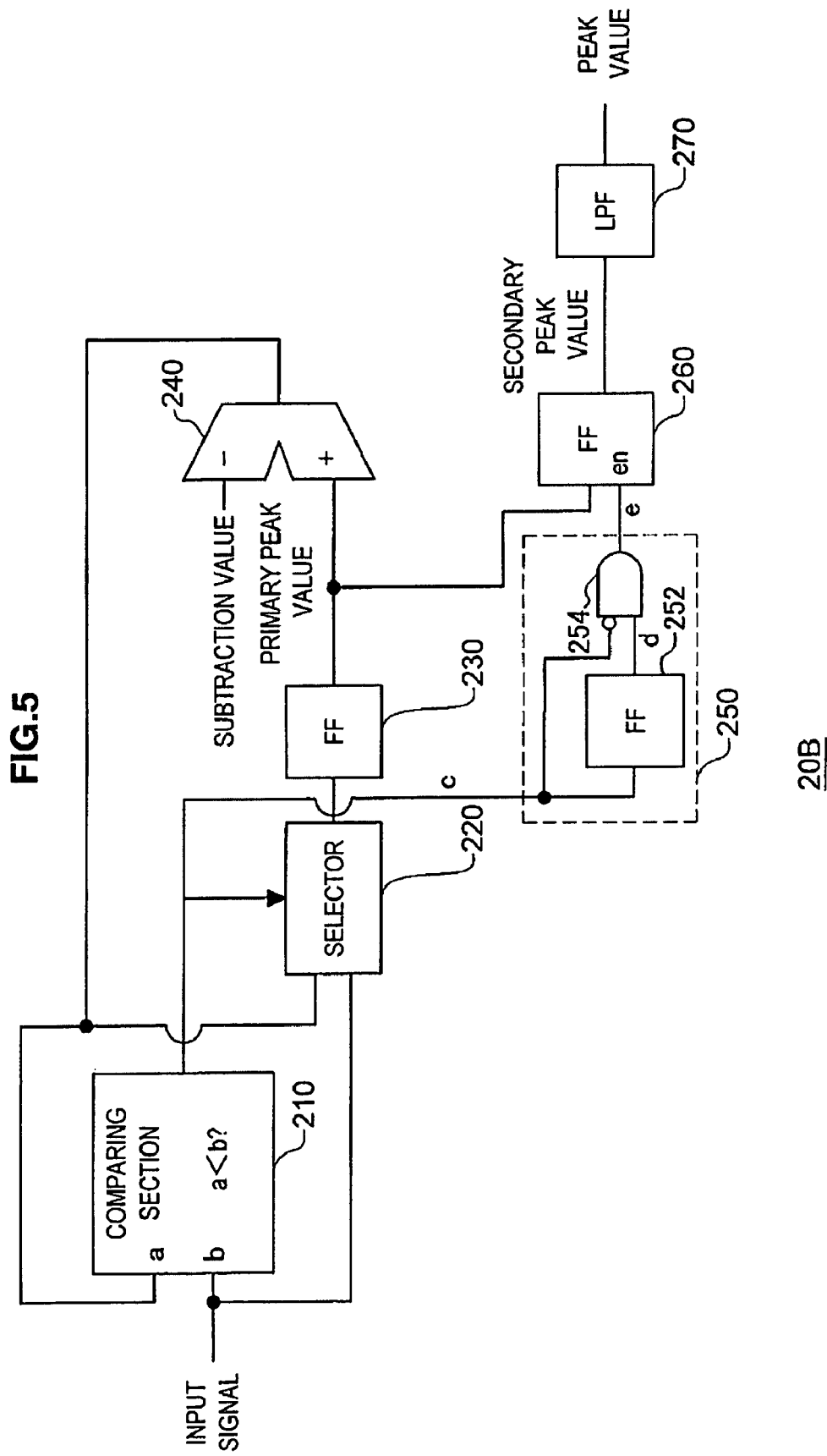
FIG. 5 is an explanatory view showing the configuration of a peak hold circuit according to a second configuration example.

FIG. 5 is an explanatory view showing the configuration of the peak hold circuit 20B according to the second configuration example. Referring to FIG. 5, the peak hold circuit 20B includes a comparing section 210, a selector 220, a flip-flop 230, a subtracting section 240, a falling edge detecting section 250, a flip-flop 260 and a low-pass filter (LPF) 270.

The comparing section 210 includes an a-terminal to receive a feedback signal that is output from the subtracting section 240 and a b-terminal to receive an input signal. The comparing section 210 has a function as a determining section that compares the signal value input through the a-terminal with the signal value input through the b-terminal and outputs a control signal according to a comparison result to the selector 220. Specifically, the comparing section 210 may output an L-signal when the signal value input through the a-terminal is larger than the signal value input through the b-terminal, and output an H-signal when the signal value input through the a-terminal is smaller than the signal value input through the b-terminal.

The selector 220 receives the feedback signal that is output from the subtracting section 240, an externally input signal, and the control signal that is output from the comparing section 210. The selector 220 outputs either one of the feedback signal or the input signal according to the control signal that is output from the comparing section 210. Specifically, the selector 220 may output the feedback signal while the L-signal is supplied from the comparing section 210, and output the input signal while the H-signal is supplied from the comparing section 210.

The flip-flip (FF) 230 has a function as a first holding section that holds the signal value of the signal that is output from the selector 220 as a primary peak value. Further, the flip-flop 230 updates the held signal value in synchronization with a reference clock.

The subtracting section 240 subtracts a prescribed subtraction value (droop rate) from the signal that is held by the flip-flip 230 and outputs a result as a feedback signal. The feedback signal is input to the comparing section 210 and the selector 220. The droop rate is variable, and the characteristics of the peak value that is obtained from the peak hold circuit 20B can be adjusted by changing the droop rate.

The falling edge detecting section 250 includes a flip-flop 252 and a logic unit 254, and it has a function as a detecting section that detects the falling edge of the input signal. Specifically, the flip-flop 252 holds the control signal that is output from the comparing section 210 for one clock period.

Then, the logic unit 254 carries out the logical AND between the control signal held by the flip-flop 252 and an inverted signal of the control signal output from the comparing section 210, and outputs a result to the flip-flop 260. Output of the H-signal as the logical AND result from the logic unit 254 indicates detection of the falling edge of the input signal as shown in FIG. 6.

Figure 6:
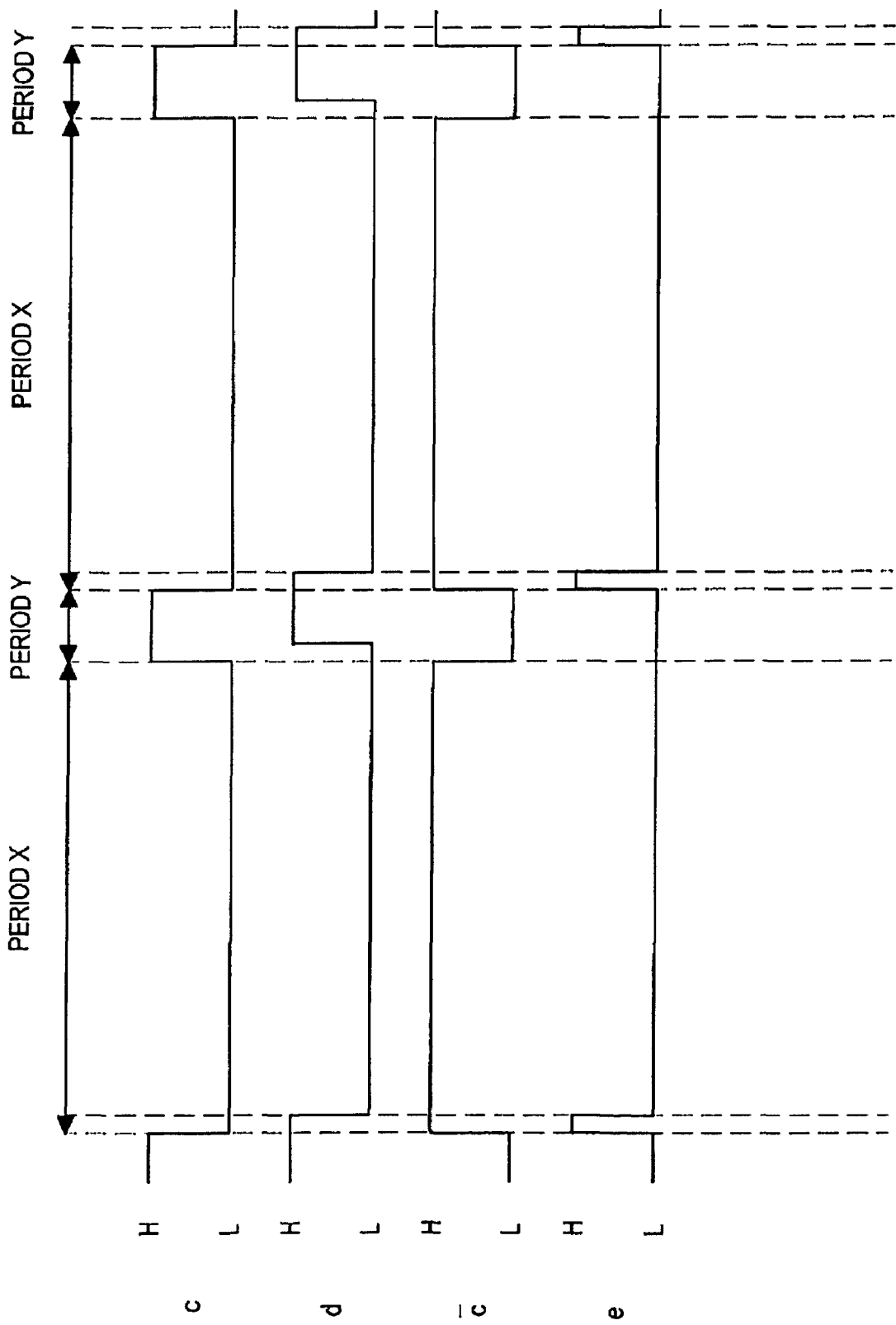
FIG. 6 is an explanatory view showing a relationship of signal values in several positions of the peak hold circuit according to the second configuration example.

FIG. 6 is an explanatory view showing a relationship of the signal values in several positions of the peak hold circuit 20B. For example, assume the case where the comparing section 210 outputs the L-signal in the period when the feedback signal is larger than the input signal (the period X) and outputs the H-signal in the period when the feedback signal is smaller than the input signal (the period Y), and the signal indicated by the first row (c) of FIG. 6 is output from the comparing section 210.

In such a case, the signal indicated by the second row (d) of FIG. 6 is input from the flip-flop 252 to the logic unit 254. The signal has a delay with respect to the signal output from the comparing section 210 as shown in the second row (d) of FIG. 6.

The logic unit 254 calculates the signal indicated by the third row (/c) of FIG. 6 as an inverted signal of the signal output from the comparing section 210. Further, the logic unit 254 carries out the logical AND between the signal indicated by the second row (d) of FIG. 6 and the signal indicated by the third row (/c) of FIG. 6, and outputs the signal indicated by the fourth row (e) of FIG. 6.

Referring to the fourth row (e) of FIG. 6, the logic unit 254 outputs the H-signal at the timing when the period Y changes to the period X. Because the period when the feedback signal is larger than the input signal is the period X and the period when the feedback signal is smaller than the input signal is the period Y, the change from the period Y to the period X indicates the falling edge of the input signal. Thus, the falling edge detecting section 250 that includes the flip-flop 252 and the logic unit 254 can output the H-signal at the falling edge of the input signal.

Referring back to FIG. 5 illustrating the configuration of the peak hold circuit 20B, the flip-flop 260 receives the signal value that is held by the flip-flop 230 and the signal that is output from the falling edge detecting section 250. Further, the flip-flop 260 has a function as a second holding section that holds and updates the signal value held by the flip-flop 230 as a secondary peak value, triggered by input of the H-signal from the falling edge detecting section 250. Thus, the flip-flop 260 updates the held signal value at each falling edge of the input signal as shown in FIG. 7.

Figure 7:
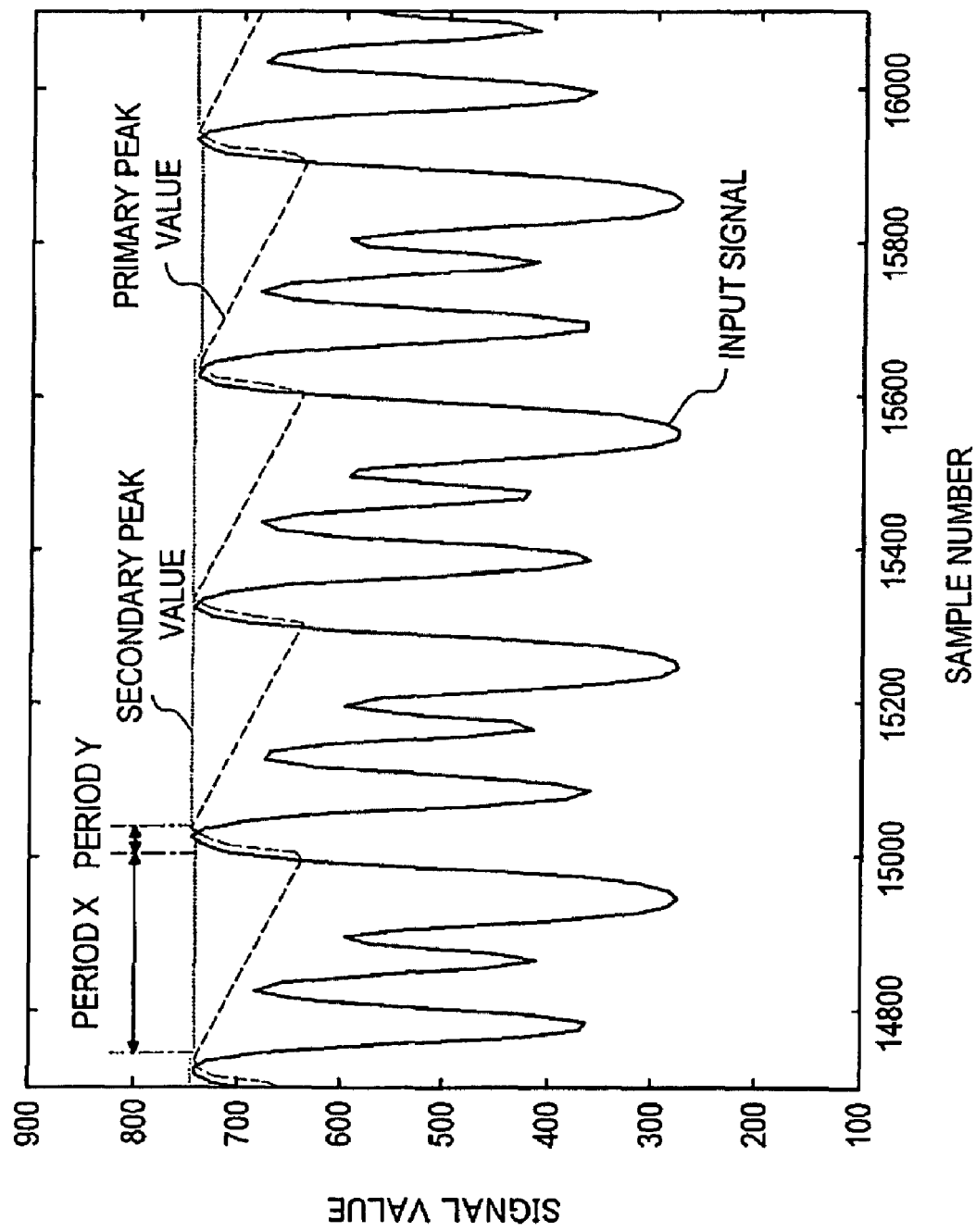
FIG. 7 is an explanatory view showing a secondary peak value held by a flip-flop according to the second configuration example.

FIG. 7 is an explanatory view showing a secondary peak value that is held by the flip-flop 260. In FIG. 7, the horizontal axis indicates a sample number of an input signal, and the vertical axis indicates a bit value of a signal value (this is the same for FIGS. 8 to 11). In FIG. 7, the solid line indicates an input signal, the dashed line indicates a primary peak value, and the dotted line indicates a secondary peak value (this is also the same for FIGS. 8 to 11).

If the input signal is a fixed pattern as shown in FIG. 7, the secondary peak value is almost constant, and the ripples that occur in the primary peak value are suppressed. Further, the issue that the peak value is smaller on average than the actual peak value of the input signal due to the droop rate, which is inevitable in the peak hold circuit 40 of the related art, is solved as shown in FIG. 7.

However, because the secondary peak value varies if the input signal varies randomly, the peak hold circuit 20B according to the second configuration example includes the low-pass filter 270. The low-pass filter 270 functions as a smoothing filter that smoothes the variation of the secondary peak value and outputs a result as a peak value.

Figure 8:
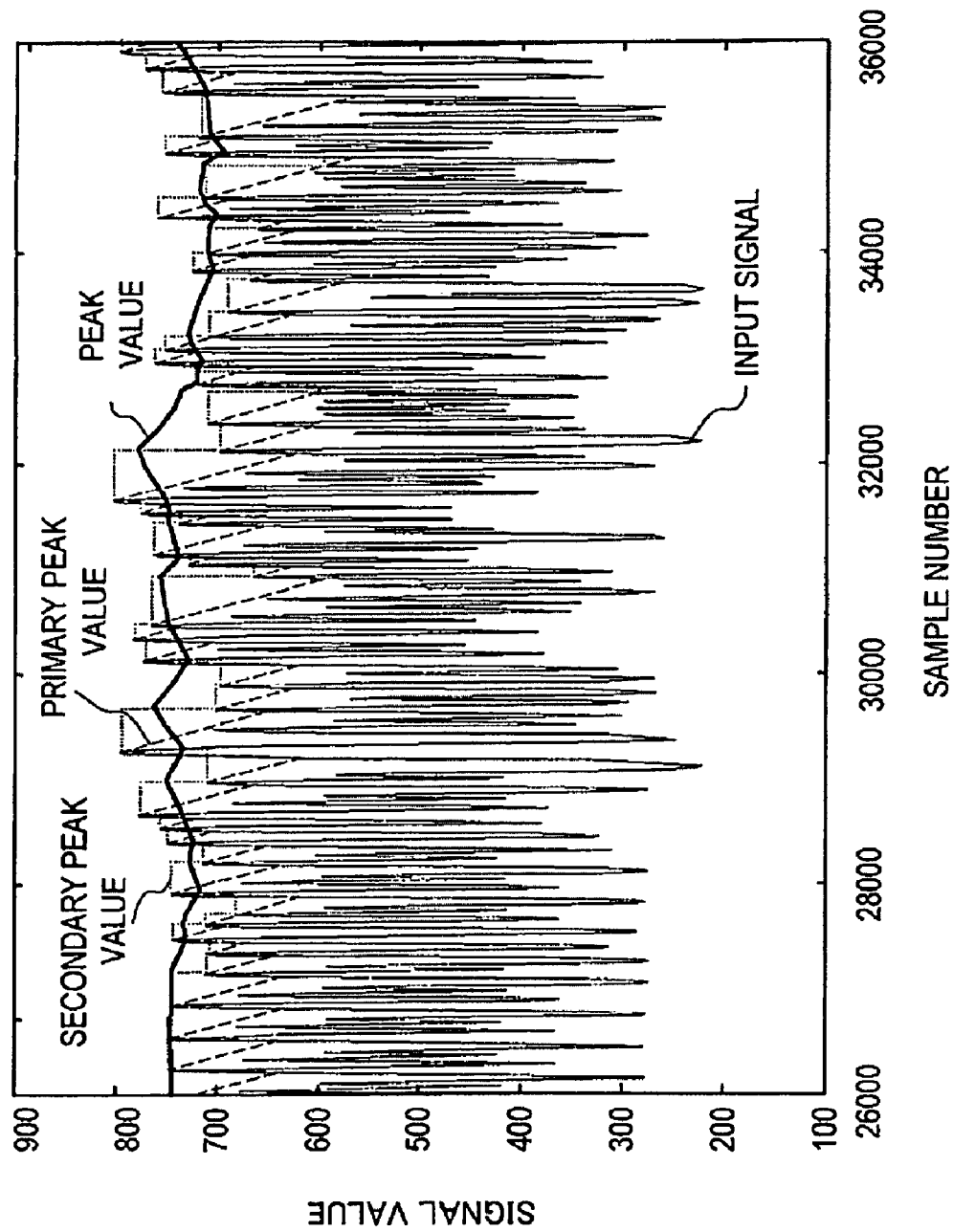
FIG. 8 is an explanatory view showing a peak value output from the peak hold circuit according to the second configuration example.

FIG. 8 is an explanatory view showing the peak value that is output from the peak hold circuit 20B. As indicated by the heavy line in FIG. 8, the peak value is a signal value in which the secondary peak value is smoothed, having a pattern that follows the actual peak value. Further, even when a peak-shaped noise is mixed in the input signal, it is possible to sufficiently eliminate the negative effect by the function of the low-pass filter 270 by setting a high droop rate. Note that the time constant of the low-pass filter 270 should be determined according to purpose and need, and FIG. 8 shows the peak value that is output from the low-pass filter 270 having an exemplary time constant by way of illustration only.

Figure 9:
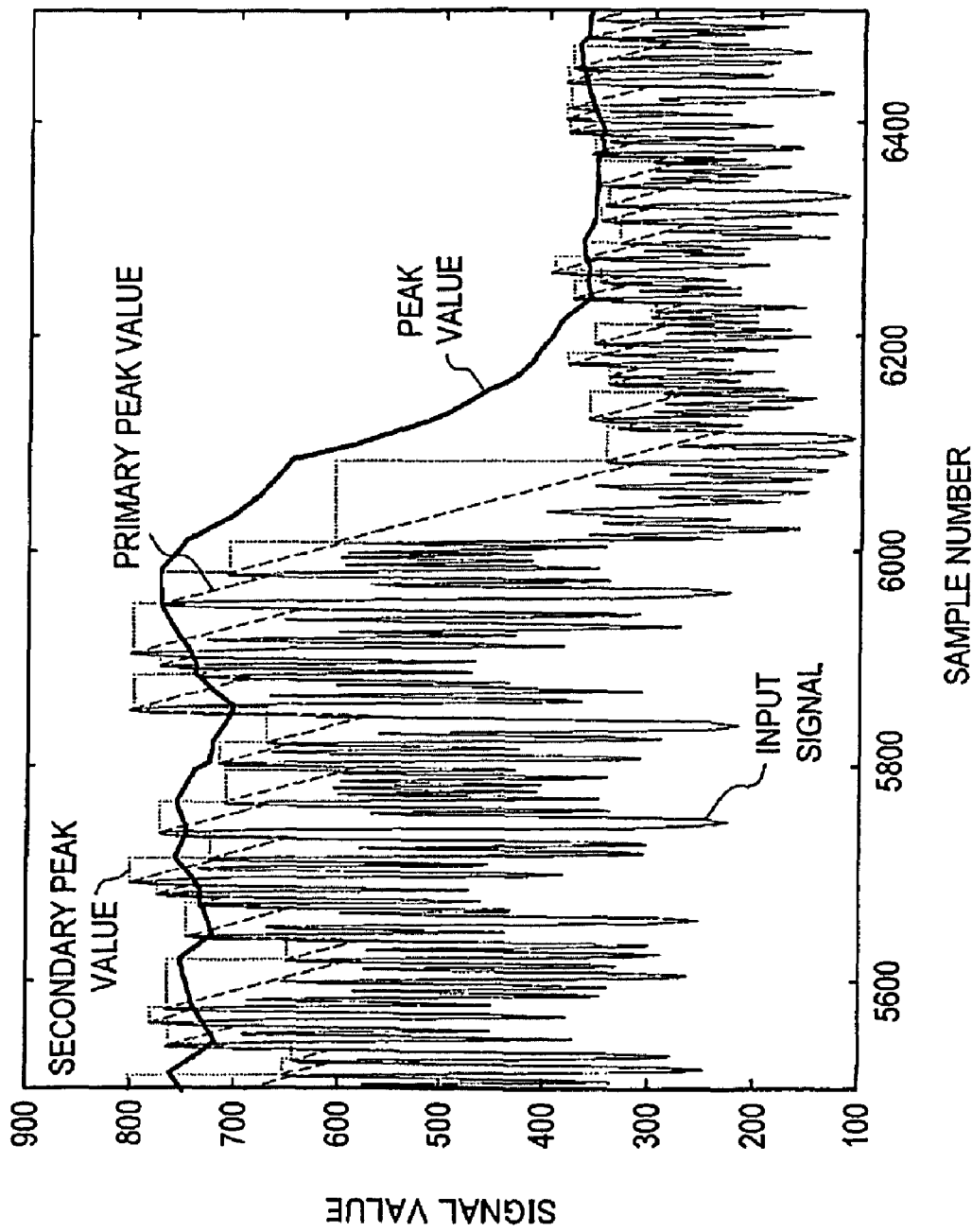
FIG. 9 is an explanatory view showing the response characteristics of a peak value with respect to a sharp falling edge according to the second configuration example.
Figure 10:
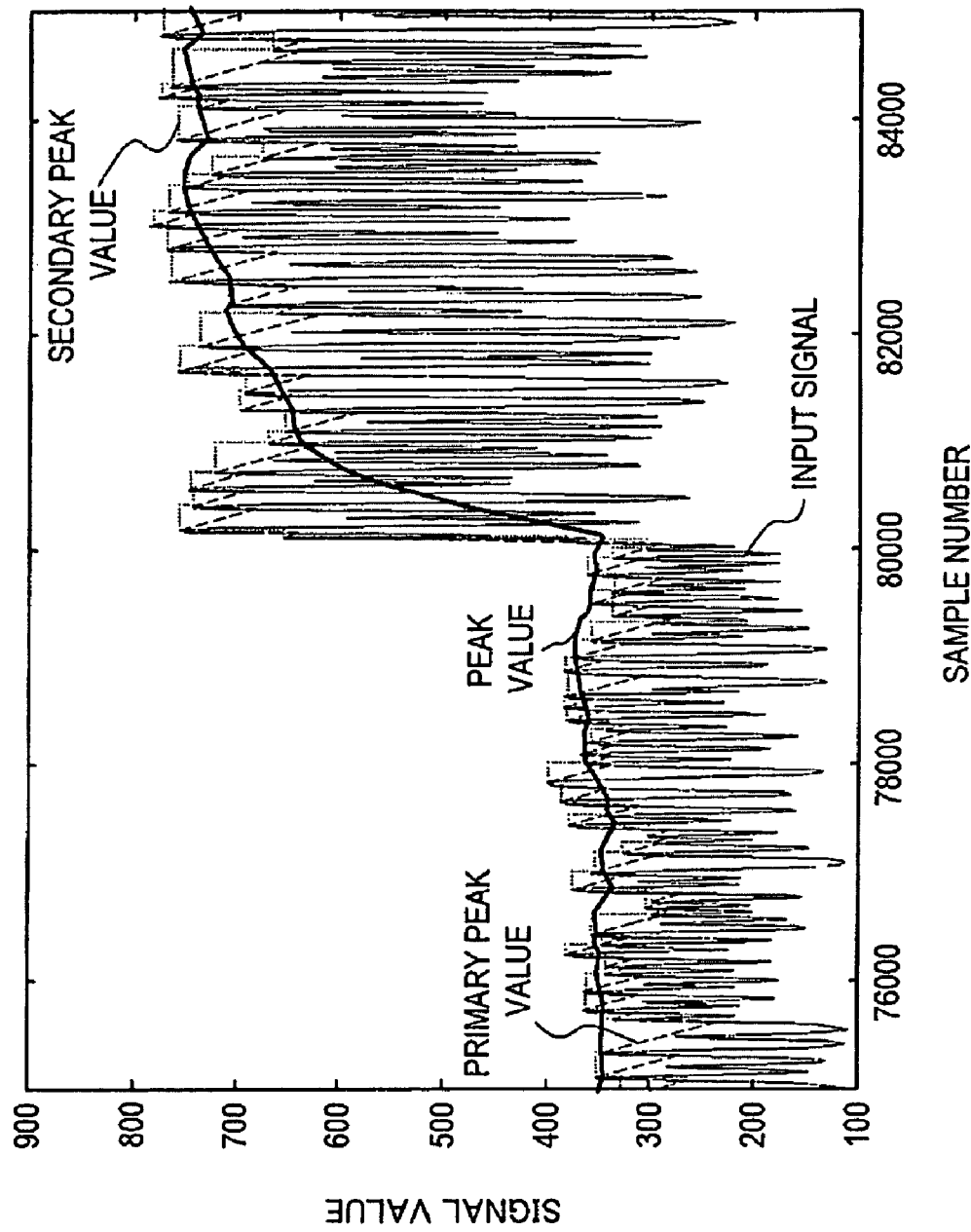
FIG. 10 is an explanatory view showing the response characteristics of a peak value with respect to a sharp rising edge according to the second configuration example.

Further, the peak hold circuit 20B according to the second configuration example can respond to the sharp falling edge and the sharp rising edge as shown in FIGS. 9 and 10, respectively.

FIG. 9 is an explanatory view showing the response characteristics of the peak value with respect to the sharp falling edge, and FIG. 10 is an explanatory view showing the response characteristics of the peak value with respect to the sharp rising edge. As shown in FIGS. 9 and 10, the peak hold circuit 20B according to the second configuration example can provide suitable following characteristics with respect to the input signal in both cases where the signal amplitude decreases abruptly and where the signal amplitude increases abruptly.

The effectiveness of the peak hold circuit 20B according to the above-described second configuration example is described hereinafter in contrast to a comparative example with reference to FIG. 11.

Figure 11:
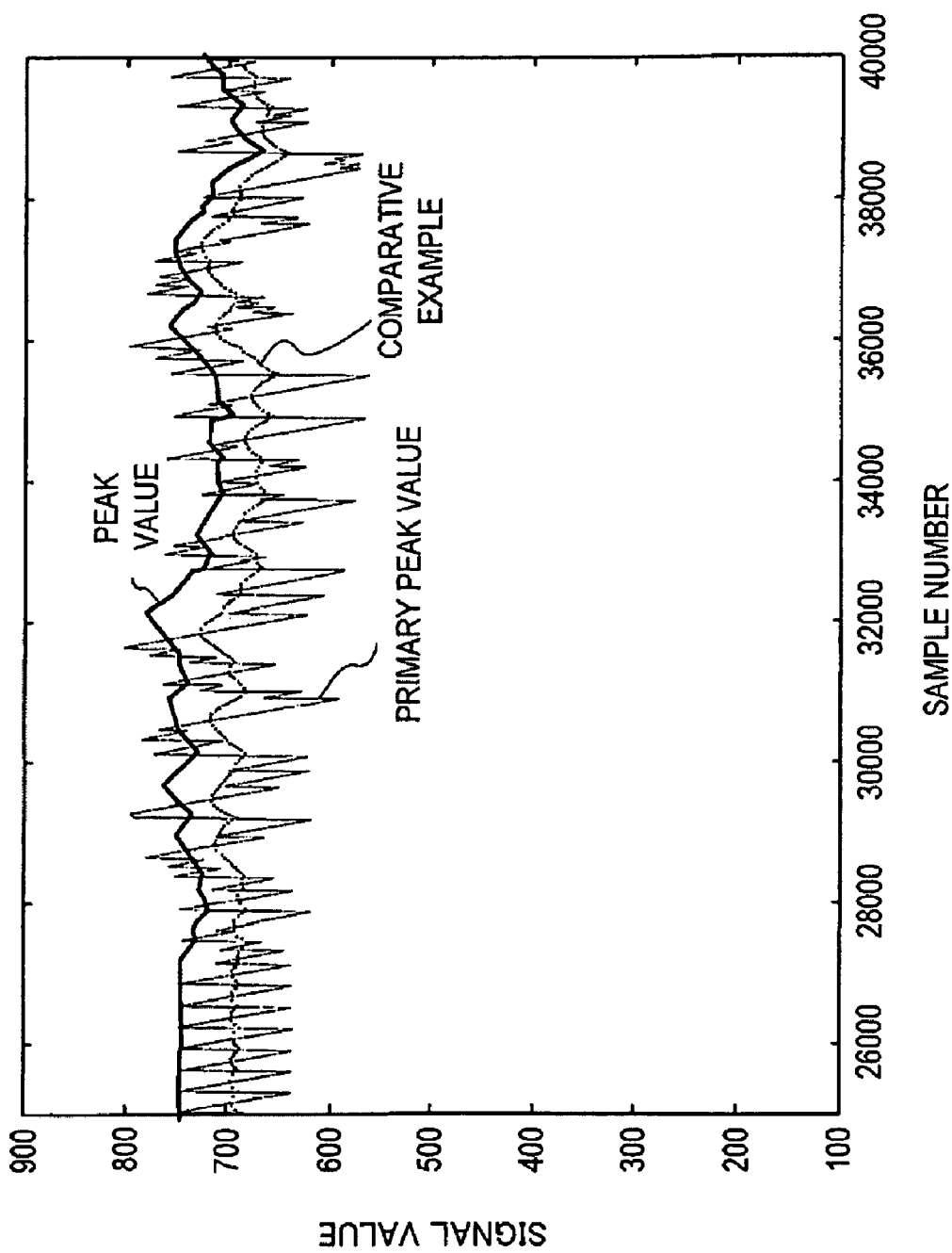
FIG. 11 is an explanatory view showing a peak value output from the peak hold circuit according to the second configuration example in contrast to a comparative example.

FIG. 11 is an explanatory view showing the peak value that is output from the peak hold circuit 20B in contrast to the comparative example. The comparative example shown in FIG. 11 is the signal value that is obtained when the primary peak value passes through a low-pass filter having the same time constant as the low-pass filter 270.

Referring to FIG. 11, the peak value that is output from the peak hold circuit 20B according to the embodiment is larger than the comparative example on the whole and substantially follows the actual peak value of the input signal. Given this graph, it seems that the peak value that is output from the peak hold circuit 20B according to the second configuration example could be obtained simply by adding a given value to the comparative example. However, it is necessary to prepare a means to determine a value to be added to the comparative example, and it is difficult to appropriately determine a value to be added.

It also seems that a signal close to the peak value that is output from the peak hold circuit 20B according to the second configuration example could be obtained by setting the droop rate to about ¼ in the comparative example. However, setting the droop rate to about ¼ causes degradation of the following characteristics with respect to the input signal having a decreasing signal amplitude.

As described above, the peak hold circuit 20B according to the second configuration example is effective in being able to improve the response to the input signal and decrease a difference between the actual peak value of the input signal and the held signal value.

(Third Configuration Example)

The peak hold circuit 20B according to the second configuration example, however, has an issue that it ceases to update an output when the input signal becomes a fixed value without a peak.

Figure 12:
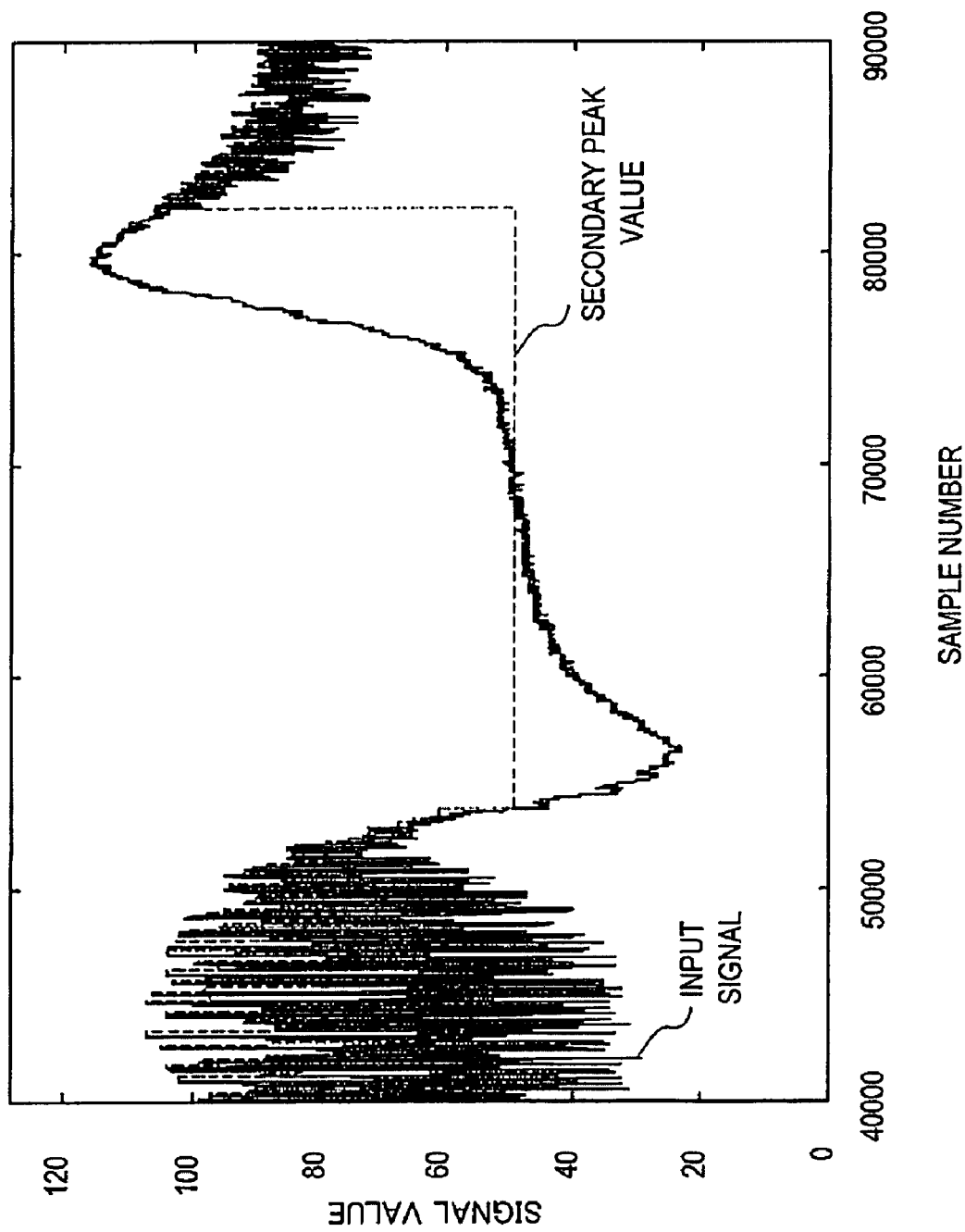
FIG. 12 is an explanatory view showing an issue in the peak hold circuit according to the second configuration example.

FIG. 12 is an explanatory view showing an issue in the peak hold circuit 20B according to the second configuration example. In FIG. 12, the input signal is indicated by the solid line, and the secondary peak value that is held by the peak hold circuit 20B is indicated by the dotted line. As shown in FIG. 12, if the input signal does not have a peak, the secondary peak value that is held by the flip-flop 260 of the peak hold circuit 20B ceases to be updated depending on a subtraction value or a noise. In contrast, a peak hold circuit 20C according to the third configuration example is capable of continuing to update the output even when the signal value suddenly becomes a fixed value. The peak hold circuit 20C according to the third configuration example is described hereinbelow.

Figure 13:
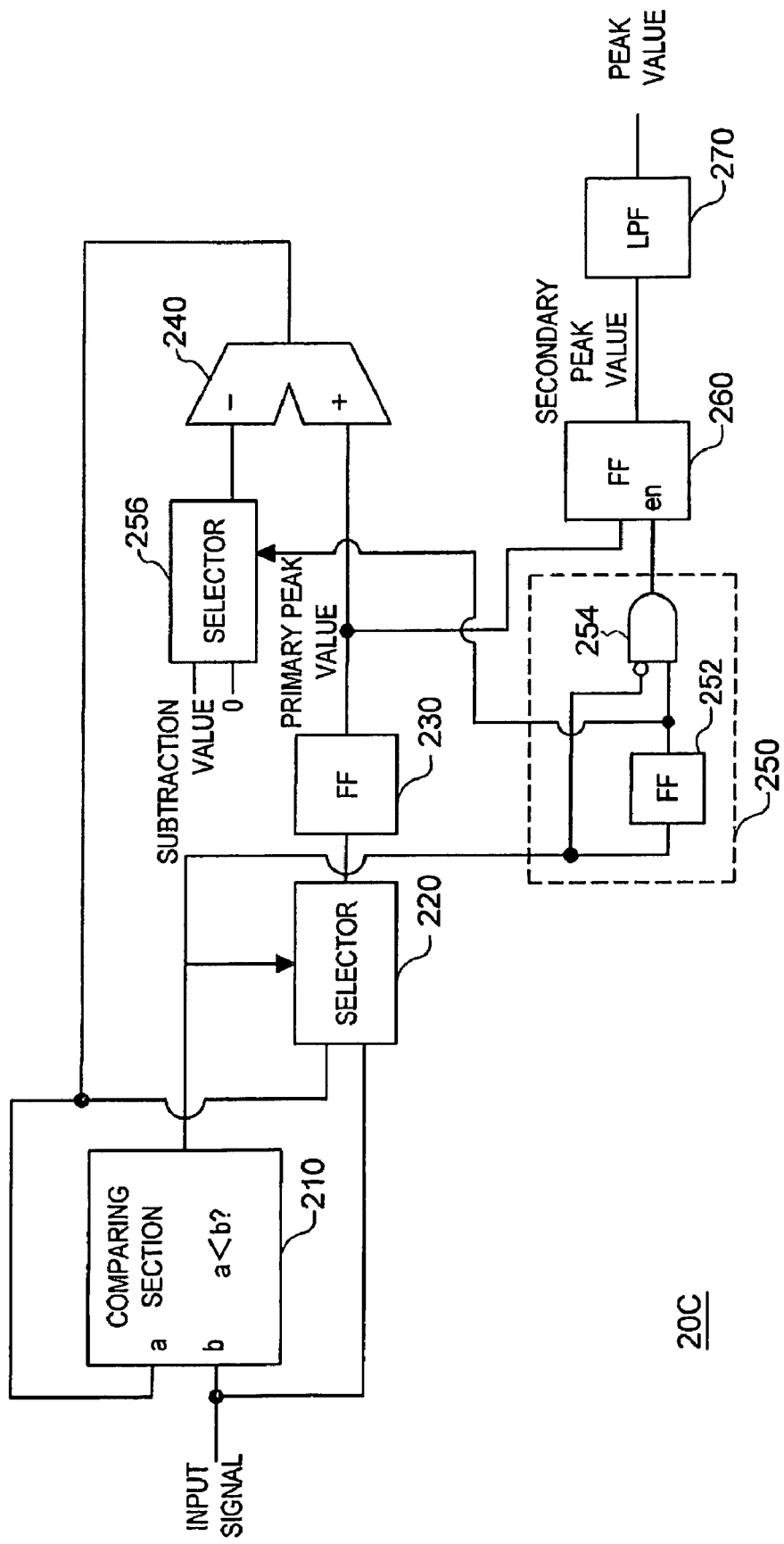
FIG. 13 is an explanatory view showing the configuration of a peak hold circuit according to a third configuration example.

FIG. 13 is an explanatory view showing the configuration of the peak hold circuit 20C according to the third configuration example. Referring to FIG. 13, the peak hold circuit 20C includes a comparing section 210, a selector 220, a flip-flop 230, a subtracting section 240, a falling edge detecting section 250, a selector 256, a flip-flop 260, and a low-pass filter (LPF) 270.

The comparing section 210 includes an a-terminal to receive a feedback signal that is output from the subtracting section 240 and a b-terminal to receive an input signal. The comparing section 210 has a function as a determining section that compares the signal value input through the a-terminal with the signal value input through the b-terminal and outputs a control signal according to a comparison result to the selector 220. Specifically, the comparing section 210 may output an L-signal when the signal value input through the a-terminal is larger than the signal value input through the b-terminal, and output an H-signal when the signal value input through the a-terminal is equal to or smaller than the signal value input through the b-terminal.

The selector 220 receives the feedback signal that is output from the subtracting section 240, an externally input signal, and the control signal that is output from the comparing section 210. The selector 220 outputs either one of the feedback signal or the input signal according to the control signal that is output from the comparing section 210. Specifically, the selector 220 may output the feedback signal while the L-signal is supplied from the comparing section 210, and output the input signal while the H-signal is supplied from the comparing section 210.

The flip-flip (FF) 230 has a function as a first holding section that holds the signal value of the signal that is output from the selector 220 as a primary peak value. Further, the flip-flop 230 updates the held signal value in synchronization with a reference clock.

If a subtraction value is specified by the selector 256, the subtracting section 240 subtracts the specified subtraction value from the signal that is held by the flip-flip 230 and outputs a result as a feedback signal. The feedback signal is input to the comparing section 210 and the selector 220. On the other hand, if a subtraction value is not specified by the selector 256 or the subtraction value is 0, the subtracting section 240 outputs the signal that is held by the flip-flip 230 without any change as a feedback signal.

The falling edge detecting section 250 includes a flip-flop 252 and a logic unit 254, and it has a function as a detecting section that detects the falling edge of the input signal, which is a transition point. As described in the second configuration example, output of the H-signal as a logical AND result from the logic unit 254 indicates detection of the falling edge of the input signal as shown in FIG. 6.

The selector 256 has a function as a control section that receives the control signal that is held by the flip-flop 252 and controls whether the subtracting section 240 performs subtraction of a subtraction value according to whether the control signal is an H-signal or an L-signal. Specifically, the selector 256 causes the subtracting section 240 to subtract a subtraction value when the control signal that is held by the flip-flop 252 is the L-signal, that is, when the input signal is equal to or smaller than the feedback signal. On the other hand, the selector 256 does not cause the subtracting section 240 to subtract a subtraction value when the control signal that is held by the flip-flop 252 is the H-signal, that is, when the input signal is larger than the feedback signal.

With the selector 256 having such a configuration, if the signal value of the input signal becomes fixed, the comparing section 210 outputs the L-signal, and the subtracting section 240 subtracts a subtraction value from the signal value that is held by the flip-flop 230 based on a direction from the selector 256 and outputs a result as a feedback signal. Next, because the signal value of the feedback signal is smaller than the fixed value of the input signal, the comparing section 210 outputs the H-signal, and the subtracting section 240 outputs the input signal that is held by the flip-flop 230 as it is without performing subtraction from its signal value.

Then, because the feedback signal and the input signal having the same signal value are input to the comparing section 210, the control signal that is output from the comparing section 210 changes from the H-signal to the L-signal. The falling edge detecting section 250 detects the change of the control signal as a falling edge, and therefore the flip-flop 260 updates the signal value held thereby to the signal value held by the flip-flop 230.

Figure 14:
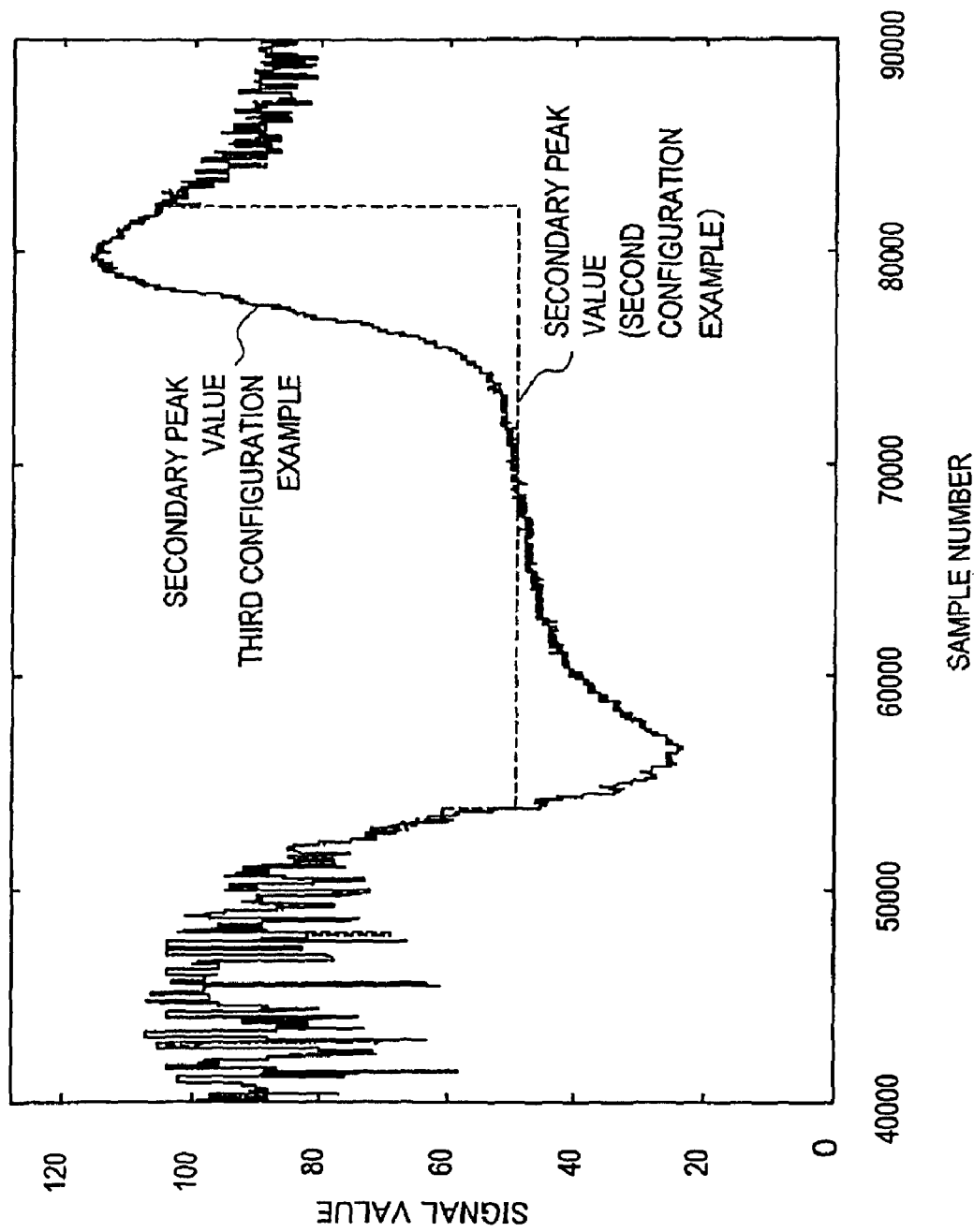
FIG. 14 is an explanatory view showing a secondary peak value held in the peak hold circuit according to the third configuration example.

After that, the above processing is repeated, and the output of the falling edge detecting section 250 is switched at each clock, so that the flip-flop 260 of the peak hold circuit 20C according to the third configuration example can hold the secondary peak value as shown in FIG. 14.

FIG. 14 is an explanatory view showing the secondary peak value that is held by the flip-flop 260 of the peak hold circuit 20C according to the third configuration example. Specifically, FIG. 14 shows the secondary peak value that is held by the flip-flop 260 of the peak hold circuit 20C in the case where the input signal shown in FIG. 12 is input and further shows the secondary peak value that is held by the flip-flop 260 of the peak hold circuit 20B as an comparative example indicated by the dotted line. As shown in FIG. 14, the flip-flop 260 of the peak hold circuit 20C according to the third configuration example allows the held signal value to follow the signal value of the input signal even when the input signal ceases to have a peak.

Although the third configuration example solves the issue in the peak hold circuit 20B according to the second configuration example by placing the selector 256, a method to solve the issue in the peak hold circuit 20B according to the second configuration example is not limited thereto. For example, it is feasible to place an element that updates the signal value held by the flip-flop 260 when a falling edge is not detected by the falling edge detecting section 250 for a prescribed time period.

For another example, it is feasible to place an element that updates the signal value held by the flip-flop 260 when the primary peak value and a primary bottom value in the bottom hold circuit 50, which is described later, are inverted. Further, it is feasible to place an element that updates the signal value held by the flip-flop 260 when the secondary peak value and a secondary bottom value in the bottom hold circuit 50, which is described later, are inverted. Furthermore, although the case where the subtracting section 240 does not perform subtraction when the input signal is larger than the feedback signal is described in the third configuration example, the selector 256 may control the subtracting section 240 so as to subtract a positive or negative value near 0.

(4) Operation of the Peak Hold Circuit

The functions of the peak hold circuit 20 (20A to 20C) according to the embodiment are described in the foregoing. In the following, a signal value holding method that is executed in the peak hold circuit 20 is described in time series with reference to FIG. 15.

Figure 15:
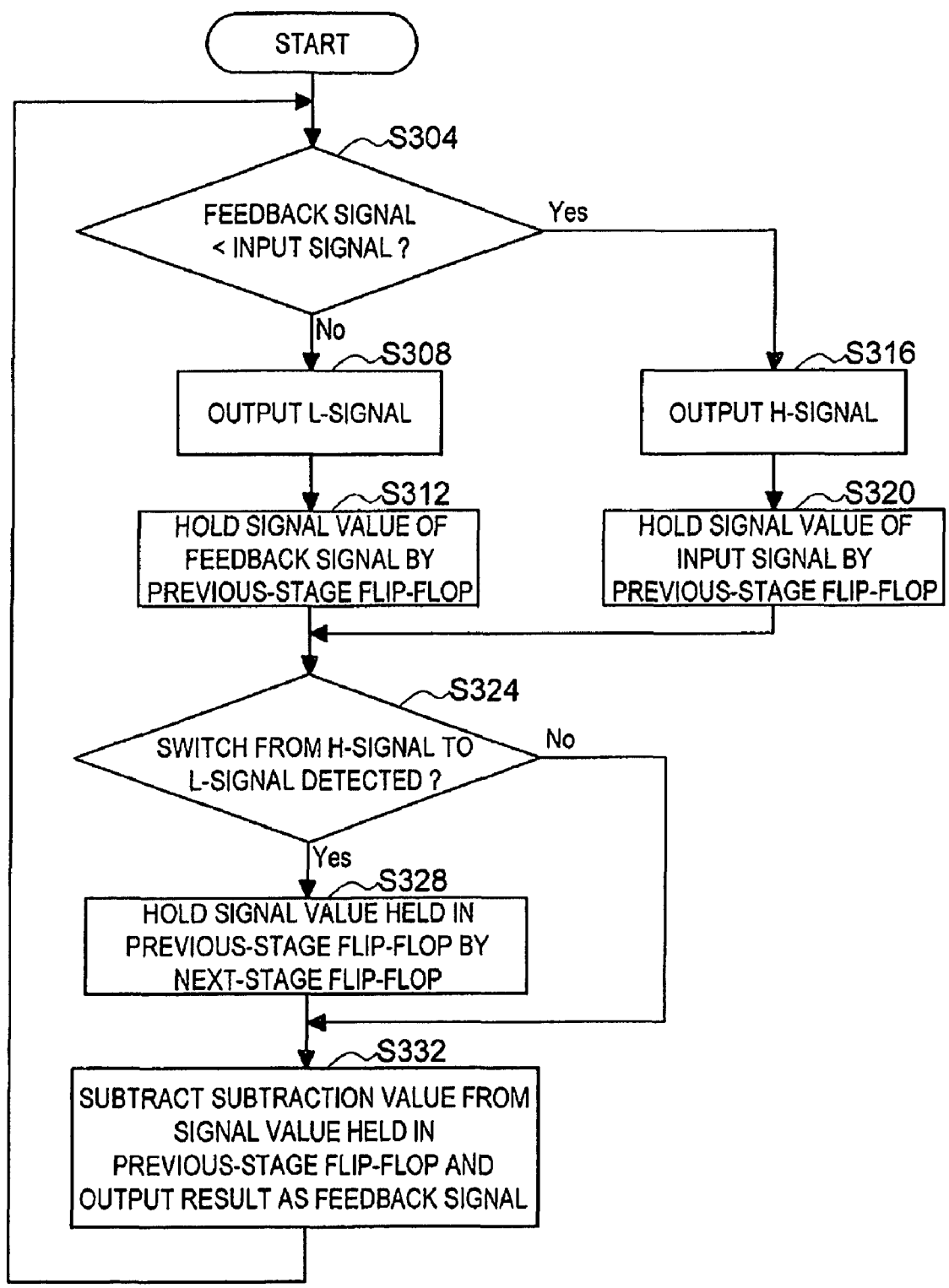
FIG. 15 is a flowchart showing the process flow of a signal value holding method executed in the peak hold circuit.

FIG. 15 is a flowchart showing the process flow of the signal value holding method that is executed in the peak hold circuit 20. FIG. 15 shows the flowchart particularly corresponding to the operation of the peak hold circuit 20B according to the second configuration example. Referring to FIG. 15, the comparing section 210 of the peak hold circuit 20 first determines a magnitude relationship between the feedback signal and the input signal (S304). If the comparing section 210 determines that the signal value of the feedback signal is larger than the signal value of the input signal, it outputs the L-signal (S308). Next, the selector 220 selectively outputs the feedback signal to the previous-stage flip-flop 230 based on the L-signal, and the flip-flop 230 holds the signal value of the feedback signal (S312).

On the other hand, if the comparing section 210 determines that the signal value of the feedback signal is equal to or smaller than the signal value of the input signal, it outputs the H-signal (S316). Next, the selector 220 selectively outputs the input signal to the previous-stage flip-flop 230 based on the H-signal, and the flip-flop 230 holds the signal value of the input signal (S320).

Then, if the falling edge detecting section 250 detects the falling edge of the input signal (S324), the next-stage flip-flop 260 holds the signal value that is held by the flip-flop 230 (S328). The signal value that is held by the flip-flop 260 is output as a peak value from the peak hold circuit 20 through the low-pass filter 270.

Further, the subtracting section 240 subtracts a subtraction value from the signal value that is held by the flip-flop 230 and outputs a result as a feedback signal (S332).

(5) Configuration of the Bottom Hold Circuit

The peak hold circuit 20 is described in detail in the foregoing with reference to FIG. 1 and FIGS. 5 to 15. In the following, the bottom hold circuit 50 that detects and holds the bottom value of the input signal is described hereinafter with reference to FIGS. 16 and 17.

Figure 16:
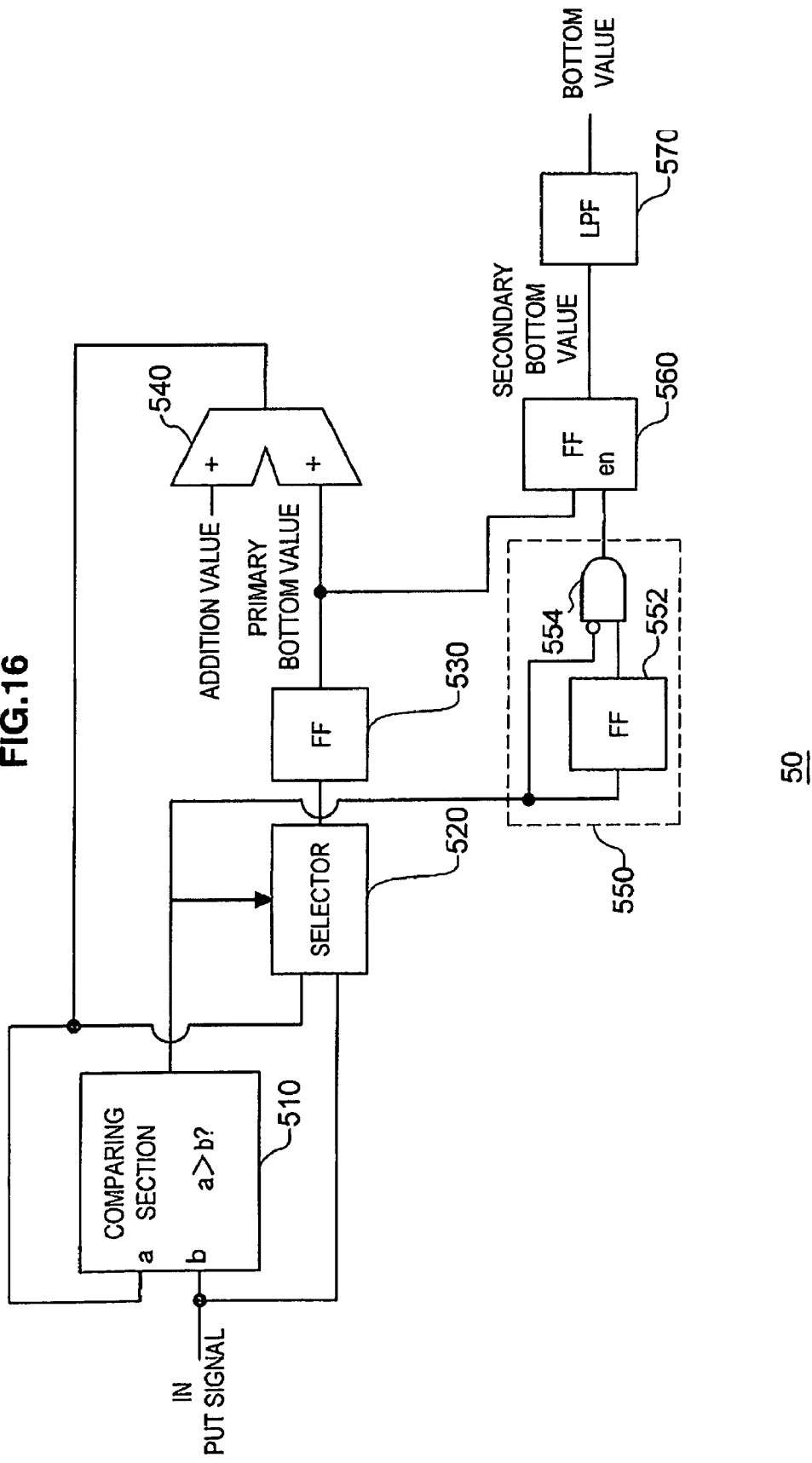
FIG. 16 is an explanatory view showing the configuration of a bottom hold circuit according to the embodiment.

FIG. 16 is an explanatory view showing the configuration of the bottom hold circuit 50 according to the embodiment. Referring to FIG. 16, the bottom hold circuit 50 includes a comparing section 510, a selector 520, a flip-flop 530, an adding section 540, a rising edge detecting section 550, a flip-flop 560, and a low-pass filter (LPF) 570.

The comparing section 510 includes an a-terminal to receive a feedback signal that is output from the adding section 540 and a b-terminal to receive an input signal. The comparing section 510 has a function as a determining section that compares the signal value input through the a-terminal with the signal value input through the b-terminal and outputs a control signal according to a comparison result to the selector 520. Specifically, the comparing section 510 may output an L-signal when the signal value input through the a-terminal is smaller than the signal value input through the b-terminal, and output an H-signal when the signal value input through the a-terminal is larger than the signal value input through the b-terminal.

The selector 520 receives the feedback signal that is output from the adding section 540, an externally input signal, and the control signal that is output from the comparing section 510. The selector 520 outputs either one of the feedback signal or the input signal according to the control signal that is output from the comparing section 510. Specifically, the selector 520 may output the feedback signal while the L-signal is supplied from the comparing section 510, and output the input signal while the H-signal is supplied from the comparing section 510.

The flip-flip (FF) 530 has a function as a first holding section that holds the signal value of the signal that is output from the selector 520 as a primary bottom value. Further, the flip-flop 530 updates the held signal value in synchronization with a reference clock.

The adding section 540 adds a prescribed addition value (attack rate) to the signal that is held by the flip-flop 530 and outputs a result as a feedback signal. The feedback signal is input to the comparing section 510 and the selector 520. The attack rate is variable, and the characteristics of the bottom value that is obtained from the bottom hold circuit 50 can be adjusted by changing the attack rate.

The rising edge detecting section 550 includes a flip-flop 552 and a logic unit 554, and it has a function as a detecting section that detects the rising edge of the input signal. Specifically, the flip-flop 552 holds the control signal that is output from the comparing section 510 for one clock period. Then, the logic unit 554 carries out the logical AND between the control signal held by the flip-flop 552 and an inverted signal of the control signal output from the comparing section 510, and outputs a result to the flip-flop 560. Output of the H-signal as the logical AND result from the logic unit 554 indicates detection of the rising edge.

The flip-flop 560 receives the signal value that is held by the flip-flop 530 and the signal that is output from the rising edge detecting section 550. Further, the flip-flop 560 has a function as a second holding section that holds and updates the signal value held by the flip-flop 530 as a secondary bottom value, triggered by input of the H-signal from the rising edge detecting section 550. Thus, the flip-flop 560 updates the held signal value at each rising edge of the input signal.

The low-pass filter 570 functions as a smoothing filter that smoothes the variation of the secondary bottom value and outputs a result as a bottom value.

(6) Operation of the Bottom Hold Circuit

The configuration of the bottom hold circuit 50 according to the embodiment is described above with reference to FIG. 16. In the following, a signal value holding method that is executed in the bottom hold circuit 50 is described in time series with reference to FIG. 17.

Figure 17:
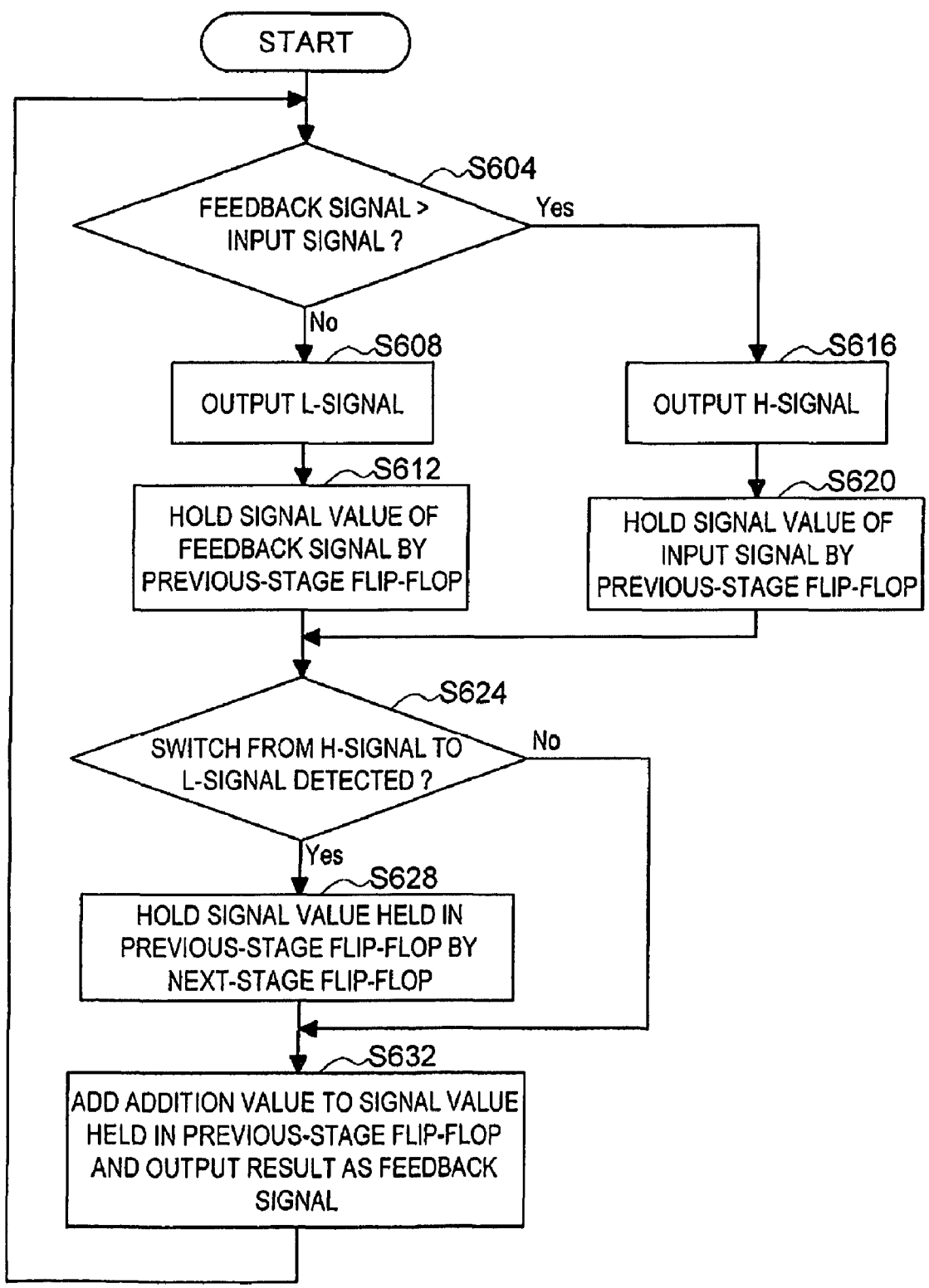
FIG. 17 is a flowchart showing the process flow of a signal value holding method executed in the bottom hold circuit.

FIG. 17 is a flowchart showing the process flow of the signal value holding method that is executed in the bottom hold circuit 50. Referring to FIG. 17, the comparing section 510 of the bottom hold circuit 50 first determines a magnitude relationship between the feedback signal and the input signal (S604). If the comparing section 510 determines that the signal value of the feedback signal is equal to or smaller than the signal value of the input signal, it outputs the L-signal (S608). Next, the selector 520 selectively outputs the feedback signal to the previous-stage flip-flop 530 based on the L-signal, and the flip-flop 530 holds the signal value of the feedback signal (S612).

On the other hand, if the comparing section 510 determines that the signal value of the feedback signal is larger than the signal value of the input signal, it outputs the H-signal (S616). Next, the selector 520 selectively outputs the input signal to the previous-stage flip-flop 530 based on the H-signal, and the flip-flop 530 holds the signal value of the input signal (S620).

Then, if the rising edge detecting section 550 detects the rising edge of the input signal (S624), the next-stage flip-flop 560 holds the signal value that is held by the flip-flop 530 (S628). The signal value that is held by the flip-flop 560 is output as a bottom value from the bottom hold circuit 50 through the low-pass filter 570.

Further, the adding section 540 adds an addition value to the signal value that is held by the flip-flop 530 and outputs a result as a feedback signal (S632).

Although the bottom hold circuit 50 corresponding to the configuration of the peak hold circuit 20B according to the second configuration example is described as an example in FIGS. 16 and 17, the rising edge detecting section 550 may be replaced by a flip-flop as in the peak hold circuit 20A, or an element corresponding to the selector 256 of the peak hold circuit 20C may be placed.

(7) Optical Disc Apparatus Including the Peak Hold Circuit and the Bottom Hold Circuit The peak hold circuit 20 and the bottom hold circuit 50 according to the embodiment are described in the foregoing. An apparatus that uses the peak hold circuit 20 and the bottom hold circuit 50 according to the embodiment is described hereinafter, taking the optical disc apparatus 60 as an example.

Figure 18:
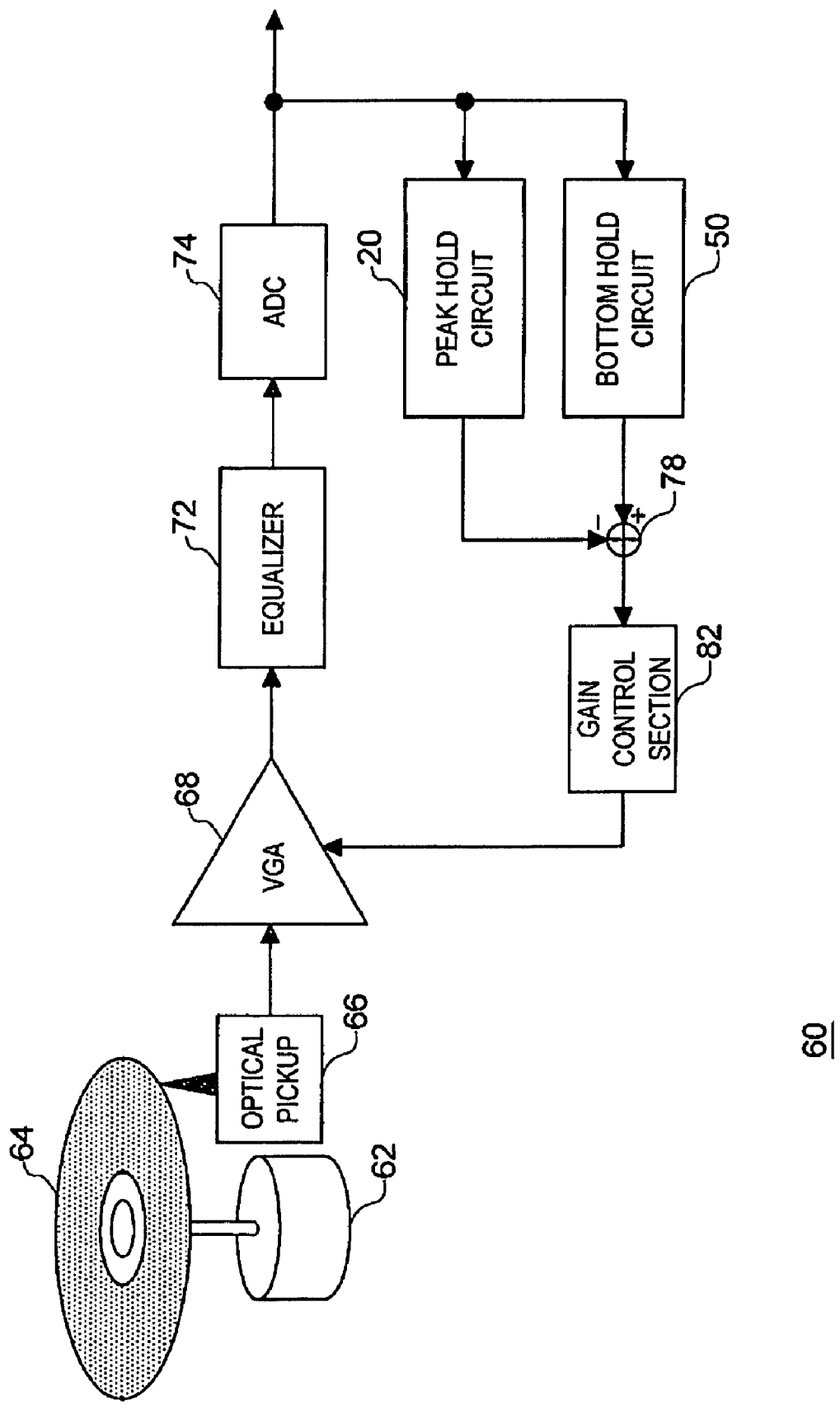
FIG. 18 is an explanatory view showing the configuration of an optical disc apparatus according to the embodiment.

FIG. 18 is an explanatory view showing the configuration of the optical disc apparatus 60 (playback apparatus) according to the embodiment. Referring to FIG. 18, the optical disc apparatus 60 includes a spindle motor 62, an optical pickup 66, a VGA 68, an equalizer 72, an ADC 74, the peak hold circuit 20, the bottom hold circuit 50, a subtractor 78, and a gain control section 82.

The spindle motor 62 drives the rotation of an optical disc 64 that is attached to the optical disc apparatus 60, and the optical pickup 66 extracts a playback signal from the recording surface of the rotating optical disc 64. Then, the VGA 68 adjusts the amplitude of the playback signal based on control by the gain control section 82.

After that, the equalizer 72 equalizes the waveform of the playback signal, and the ADC 74 converts the playback signal from an analog format to a digital format. Then, the playback signal converted from analog to digital by the ADC 74 is input as an input signal to the peak hold circuit 20 and the bottom hold circuit 50, which are described in the foregoing. The peak hold circuit 20 detects and outputs the peak value of the input signal, and the bottom hold circuit 50 detects and outputs the bottom value of the input signal.

Then, the subtractor 78 calculates a difference between the peak value and the bottom value. The difference between the peak value and the bottom value indicates the signal amplitude. Thus, the gain control section 82 can determine the amount to adjust the gain by the VGA 68 based on the difference between the peak value and the bottom value. A low-pass filter may be placed between the subtractor 78 and the gain control section 82, so that the gain control section 82 can determine the gain adjustment amount based on the output of the subtractor 78 that is smoothed by the low-pass filter. In such a case, the peak hold circuit 20 and the bottom hold circuit 50 may not include the low-pass filter.

(8) Summary

As described in the foregoing, in the peak hold circuit 20 according to the embodiment, because the flip-flop 260 holds the signal value that is supplied from the flip-flop 230 when the signal value of the input signal becomes smaller than the signal value of the feedback signal, the flip-flop 260 can hold the signal value that is closer to the peak value of the input signal even if a subtraction value that is subtracted by the subtracting section 240 increases.

Further, in the bottom hold circuit 50 according to the embodiment, because the flip-flop 560 holds the signal value that is supplied from the flip-flop 530 when the signal value of the input signal becomes larger than the signal value of the feedback signal, the flip-flop 560 can hold the signal value that is closer to the bottom value of the input signal even if an addition value that is added by the adding section 540 increases.

It should be understood by those skilled in the art that various modifications, combinations, sub-combinations and alterations may occur depending on design requirements and other factors insofar as they are within the scope of the appended claims or the equivalents thereof.

For example, although the case where the peak hold circuit 20 includes the falling edge detecting section 250 is described in the above-mentioned embodiment, the present application is not limited thereto. For example, the L-signal or the H-signal that is output from the comparing section 210 may be directly input to the flip-flop 260. In such a case, the flip-flop 260 may update the signal value that is held by the flip-flop 230 for the period Y during which the H-signal output from the comparing section 210 is input when the signal value of the input signal is larger than the signal value of the feedback signal.

In such a configuration as well, the flip-flop 260 can hold the signal value that is close to the actual peak value of the input signal during the period X. Further, the peak hold circuit 20 can constantly output the signal value that is close to the actual peak value of the input signal if the signal value held by the flip-flop 260 passes through the low-pass filter 270.

Further, it is not necessary to perform each step in the processing of the peak hold circuit 20 or the bottom hold circuit 50 in chronological order according to the sequence shown in the flowchart. For example, each step in the processing of the peak hold circuit 20 or the bottom hold circuit 50 may include the processing that is executed in parallel or individually (e.g. parallel processing or object processing).

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A signal value holding apparatus comprising:
   a determining section to determine a magnitude relationship between a signal value of an input signal and a signal value of a prescribed feedback signal;
   a first holding section to hold the signal value determined to be larger by the determining section;
   a subtracting section to subtract a prescribed value from the signal value held by the first holding section and output a result as the feedback signal; and
   a second holding section to receive the signal value held by the first holding section and hold the signal value supplied from the first holding section when the signal value of the input signal becomes smaller than the signal value of the feedback signal based on a determination result of the magnitude relationship between the signal values by the determining section.

2. The signal value holding apparatus according to claim 1, wherein
   the second holding section updates the held signal value while the signal value of the input signal is determined to be larger than the signal value of the feedback signal by the determining section, and holds the signal value while the signal value of the input signal is determined to be smaller than the signal value of the feedback signal by the determining section.

3. The signal value holding apparatus according to claim 1, further comprising:
   a detecting section to detect a transition point where the signal value of the input signal becomes smaller than the signal value of the feedback signal based on a determination result of the magnitude relationship between the signal values by the determining section, wherein
   the second holding section updates the held signal value when the transition point is detected by the detecting section and holds the updated signal value until the next transition point is detected.

4. The signal value holding apparatus according to claim 1, further comprising:
   a detecting section to detect a transition point where the signal value of the input signal becomes smaller than the signal value of the feedback signal based on a determination result of the magnitude relationship between the signal values by the determining section; and
   a control section to change the prescribed value to zero or near zero while the signal value of the input signal is determined to be larger than the signal value of the feedback signal by the determining section, wherein
   the second holding section updates the held signal value when the transition point is detected by the detecting section and holds the updated signal value until the next transition point is detected.

5. The signal value holding apparatus according to claim 1, further comprising:
   a selector to receive the input signal and the feedback signal, wherein
   the selector outputs the signal value determined to be larger by the determining section to the first holding section.

6. The signal value holding apparatus according to claim 1, wherein
   the prescribed value subtracted from the signal value held by the first holding section in the subtracting section is variable.

7. The signal value holding apparatus according to claim 1, further comprising:
   a smoothing filter to smooth a variation of the signal value held by the second holding section and output the smoothed signal.

8. A signal value holding method comprising the steps of:
   determining a magnitude relationship between a signal value of an input signal and a signal value of a prescribed feedback signal;
   holding by a first holding section the signal value determined to be larger by the determination;
   subtracting a prescribed value from the signal value held by the first holding section and outputting a result as the feedback signal;
   inputting the signal value held by the first holding section to a second holding section; and
   holding by the second holding section the signal value supplied from the first holding section when the signal value of the input signal becomes smaller than the signal value of the feedback signal based on a determination result of the magnitude relationship between the signal values.

9. A signal value control system comprising:
   a first signal value holding apparatus;
   a control apparatus; and
   a signal value adjusting apparatus, wherein
   the first signal value holding apparatus includes:
      a first determining section to determine a magnitude relationship between a signal value of an input signal from the signal value adjusting apparatus and a signal value of a prescribed feedback signal;
      a first holding section to hold the signal value determined to be larger by the first determining section;
      a subtracting section to subtract a prescribed value from the signal value held by the first holding section and output a result as the feedback signal; and
      a second holding section to receive the signal value held by the first holding section and hold the signal value supplied from the first holding section when the signal value of the input signal becomes smaller than the signal value of the feedback signal based on a determination result of the magnitude relationship between the signal values by the first determining section, the control apparatus controls the signal value adjusting apparatus based on the signal value held by the second holding section of the first signal value holding apparatus, and the signal value adjusting apparatus adjusts a signal value of an externally input signal based on control by the control apparatus and outputs the adjusted signal.

10. The signal value control system according to claim 9, further comprising:

a second signal value holding apparatus including:

a second determining section to determine a magnitude relationship between a signal value of the input signal and a signal value of a prescribed second feedback signal;

a third holding section to hold the signal value determined to be smaller by the second determining section;

an adding section to add a prescribed value to the signal value held by the third holding section and output a result as the second feedback signal; and a fourth holding section to receive the signal value held by the third holding section and hold the signal value supplied from the third holding section when the signal value of the input signal becomes larger than the signal value of the second feedback signal based on a determination result of the magnitude relationship between the signal values by the second determining section, wherein the control apparatus controls the signal value adjusting apparatus based on a difference between the signal value held by the second holding section of the first signal value holding apparatus and the signal value held by the fourth holding section of the second signal value holding apparatus.

11. A signal value control method executed in a signal value control system including a signal value holding apparatus, a control apparatus and a signal value adjusting apparatus, comprising the steps of:

determining a magnitude relationship between a signal value of an input signal from the signal value adjusting apparatus and a signal value of a prescribed feedback signal in the signal value holding apparatus;

holding by a first holding section the signal value determined to be larger by the determination in the signal value holding apparatus;

subtracting a prescribed value from the signal value held by the first holding section and outputting a result as the feedback signal in the signal value holding apparatus;

inputting the signal value held by the first holding section to a second holding section in the signal value holding apparatus;

holding by the second holding section the signal value supplied from the first holding section when the signal value of the input signal becomes smaller than the signal value of the feedback signal based on a determination result of the magnitude relationship between the signal values in the signal value holding apparatus;

controlling the signal value adjusting apparatus based on the signal value held by the second holding section of the signal value holding apparatus in the control apparatus; and adjusting a signal value of an externally input signal based on control by the control apparatus and outputting the adjusted signal in the signal value adjusting apparatus.

12. A signal value holding apparatus comprising:

a determining section to determine a magnitude relationship between a signal value of an input signal and a signal value of a prescribed feedback signal;

a first holding section to hold the signal value determined to be smaller by the determining section;

an adding section to add a prescribed value to the signal value held by the first holding section and output a result as the feedback signal; and a second holding section to receive the signal value held by the first holding section and hold the signal value supplied from the first holding section when the signal value of the input signal becomes larger than the signal value of the feedback signal based on a determination result of the magnitude relationship between the signal values by the determining section.

13. A signal value control method comprising the steps of:

determining a magnitude relationship between a signal value of an input signal and a signal value of a prescribed feedback signal;

holding by a first holding section the signal value determined to be smaller by the determination;

adding a prescribed value to the signal value held by the first holding section and outputting a result as the feedback signal;

inputting the signal value held by the first holding section to a second holding section; and holding by the second holding section the signal value supplied from the first holding section when the signal value of the input signal becomes larger than the signal value of the feedback signal based on a determination result of the magnitude relationship between the signal values.

14. A playback apparatus comprising:

an optical pickup to read information recorded on an optical disc and output the information as a playback signal;

a first signal value holding section to hold a maximum value of the playback signal output from the optical pickup;

a second signal value holding section to hold a minimum value of the playback signal;

a calculating section to calculate a difference between a signal value held by the first signal value holding section and a signal value held by the second signal value holding section; and an amplitude adjusting section to adjust an amplitude of the playback signal based on the difference calculated by the calculating section, wherein the first signal value holding section includes:

a first determining section to determine a magnitude relationship between a signal value of the playback signal and a signal value of a prescribed first feedback signal;

a first holding section to hold the signal value determined to be larger by the first determining section;

a subtracting section to subtract a prescribed value from the signal value held by the first holding section and output a result as the first feedback signal; and a second holding section to receive the signal value held by the first holding section and hold the signal value supplied from the first holding section as the maximum value when the signal value of the playback signal becomes smaller than the signal value of the first feedback signal based on a determination result of the magnitude relationship between the signal values by the first determining section, and the second signal value holding section includes:
- a second determining section to determine a magnitude relationship between the signal value of the playback signal and a signal value of a prescribed second feedback signal;
- a third holding section to hold the signal value determined to be smaller by the second determining section;
- an adding section to add a prescribed value to the signal value held by the third holding section and output a result as the second feedback signal; and
- a fourth holding section to receive the signal value held by the third holding section and hold the signal value supplied from the third holding section as the minimum value when the signal value of the playback signal becomes larger than the signal value of the second feedback signal based on a determination result of the magnitude relationship between the signal values by the second determining section.

15. A playback method comprising the steps of:
reading information recorded on an optical disc and outputting the information as a playback signal;
holding by a first signal value holding section a maximum value of the playback signal;
holding by a second signal value holding section a minimum value of the playback signal;
calculating a difference between a signal value held by the first signal value holding section and a signal value held by the second signal value holding section; and
adjusting an amplitude of the playback signal based on the difference, wherein
the holding step by the first signal value holding section includes:
- determining a magnitude relationship between a signal value of the playback signal and a signal value of a prescribed first feedback signal;
- holding by a first holding section the signal value determined to be larger by the determination;
- subtracting a prescribed value from the signal value held by the first holding section and outputting a result as the first feedback signal; and
- receiving the signal value held by the first holding section and holding by a second holding section the signal value supplied from the first holding section as the maximum value when the signal value of the playback signal becomes smaller than the signal value of the first feedback signal based on a determination result of the magnitude relationship between the signal values, and the holding step by the second signal value holding section includes:
- determining a magnitude relationship between the signal value of the playback signal and a signal value of a prescribed second feedback signal;
- holding by a third holding section the signal value determined to be smaller by the determination;
- adding a prescribed value to the signal value held by the third holding section and outputting a result as the second feedback signal; and
- receiving the signal value held by the third holding section and holding by a fourth holding section the signal value supplied from the third holding section as the minimum value when the signal value of the playback signal becomes larger than the signal value of the second feedback signal based on a determination result of the magnitude relationship between the signal values.

* * * * *